US007463506B2

(12) United States Patent
Muraoka et al.

(10) Patent No.: US 7,463,506 B2
(45) Date of Patent: Dec. 9, 2008

(54) MEMORY DEVICE, MEMORY CIRCUIT AND SEMICONDUCTOR INTEGRATED CIRCUIT HAVING VARIABLE RESISTANCE

(75) Inventors: Shunsaku Muraoka, Osaka (JP); Koichi Osano, Osaka (JP); Ken Takahashi, Osaka (JP); Masafumi Shimotashiro, Osaka (JP)

(73) Assignee: Panasonic Corporation, Osaka (JP)

( * ) Notice: Subject to any disclaimer, the term of this patent is extended or adjusted under 35 U.S.C. 154(b) by 149 days.

(21) Appl. No.: 10/584,617

(22) PCT Filed: Oct. 22, 2004

(86) PCT No.: PCT/JP2004/016082

§ 371 (c)(1),
(2), (4) Date: Jun. 26, 2006

(87) PCT Pub. No.: WO2005/066969

PCT Pub. Date: Jul. 21, 2005

(65) Prior Publication Data

US 2007/0159867 A1 Jul. 12, 2007

(30) Foreign Application Priority Data

| Dec. 26, 2003 | (JP) | ............................. 2003-435269 |
| Apr. 27, 2004 | (JP) | ............................. 2004-131542 |
| Jun. 4, 2004 | (JP) | ............................. 2004-167223 |

(51) Int. Cl.
*G11C 11/00* (2006.01)
(52) U.S. Cl. .......................... 365/148; 365/46; 365/100
(58) Field of Classification Search ................. 365/148, 365/46, 100
See application file for complete search history.

(56) References Cited

U.S. PATENT DOCUMENTS 5,969,990 A 10/1999 Arase et al.

(Continued)

FOREIGN PATENT DOCUMENTS

EP 1 426 966 A 6/2004

(Continued)

OTHER PUBLICATIONS

Korean Office Action, issued in Korean Patent Application No. 10-2006-7013643, dated on Mar. 12, 2008.

(Continued)

*Primary Examiner*—Richard Elms
*Assistant Examiner*—Nam Nguyen
(74) *Attorney, Agent, or Firm*—McDermott Will & Emery LLP

(57) ABSTRACT

A first variable resistor (5) is connected between a first terminal (7) and a third terminal (9) and increases/reduces its resistance value in accordance with the polarity of a pulse voltage applied between the first terminal (7) and the third terminal (9). A second variable resistor (6) is connected between the third terminal (9) and a second terminal (8) and increases/reduces its resistance value in accordance with the polarity of a pulse voltage applied between the third terminal (9) and the second terminal (8). Given pulse voltages are applied between the first terminal (7) and the third terminal (9) and between the third terminal (9) and the second terminal (8) to reversibly change the resistance values of the first and second variable resistors (5, 6), thereby recording one bit or multiple bits of information.

17 Claims, 30 Drawing Sheets

U.S. PATENT DOCUMENTS

| | | | |
|---|---|---|---|
| 6,226,197 B1 | 5/2001 | Nishimura | |
| 6,278,138 B1 | 8/2001 | Suzuki | |
| 6,344,991 B1 | 2/2002 | Mikami et al. | |
| 6,473,332 B1 | 10/2002 | Charlson et al. | |
| 6,574,138 B2 | 6/2003 | Schwarzl et al. | |
| 6,583,003 B1 | 6/2003 | Hsu et al. | |
| 6,737,726 B2 * | 5/2004 | Gilton | 257/529 |
| 2003/0038301 A1 | 2/2003 | Moore | |

FOREIGN PATENT DOCUMENTS

| | | |
|---|---|---|
| EP | 1 455 363 A | 9/2004 |
| WO | WO 02/19337 A | 3/2002 |
| WO | WO 03/041172 A1 | 5/2003 |

OTHER PUBLICATIONS

Zhuang et al. "Novell Colossal Magnetoresistive Thin Film Nonvolatile Resistance random Access Memory (RRAM)" IEEE, IEDM, 2002, 193-196.

Zhuang W., et al. "Novel colossal magnetoresistive thin film nonvolatile resistance random access memory (RRAM)" Technical Digest of International Electron Devices Meeting 2002, San Francisco, CA, Dec. 8-11; New York, NY Dec. 8, pp. 193-196.

Korean Office Action issued in Korean Patent Application No. KR 10-2007-7025668, mailed Oct. 9, 2008.

* cited by examiner

FIG. 2
(a) VARIABLE RESISTOR α
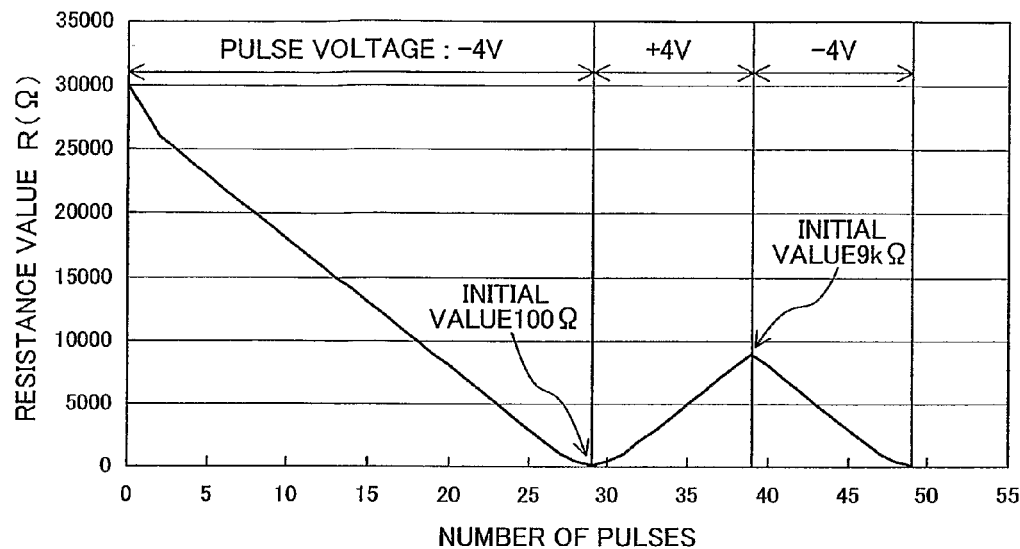
(b) VARIABLE RESISTOR β
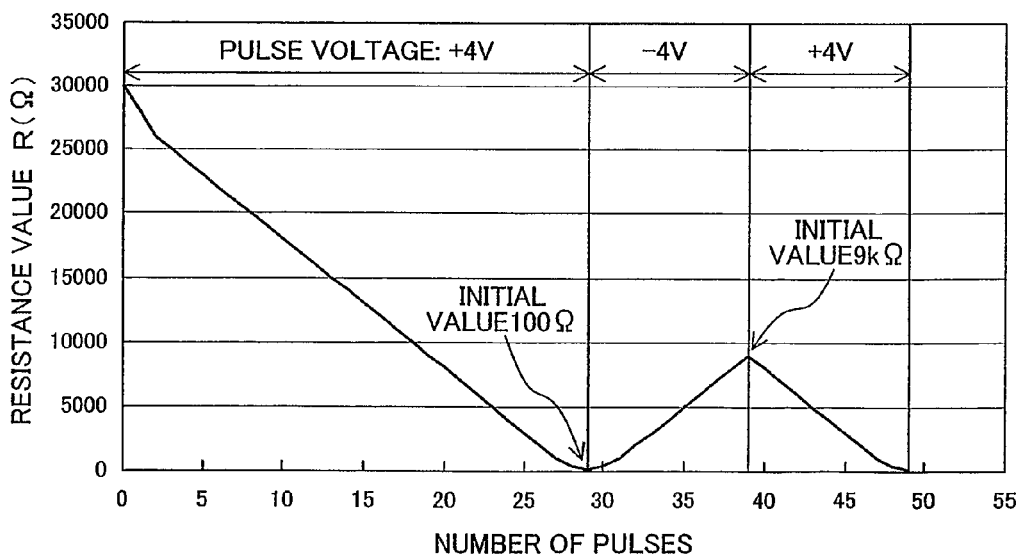

FIG. 3
(a) VARIABLE RESISTOR α
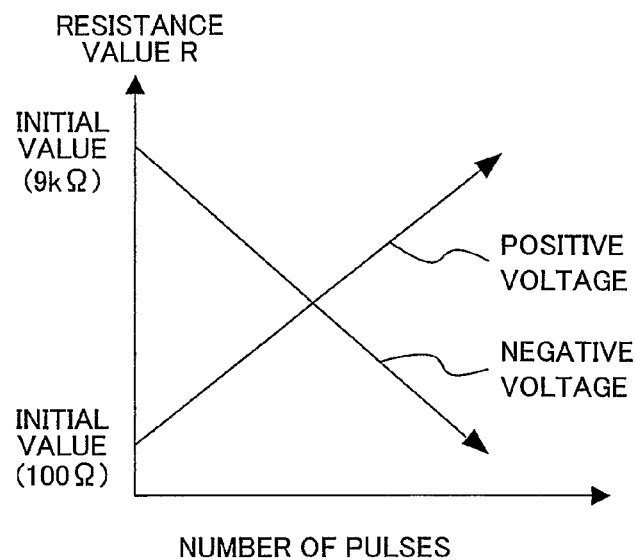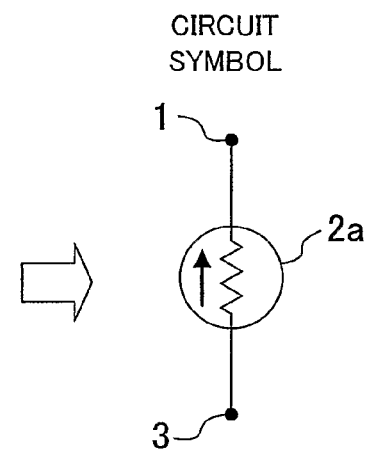
(b) VARIABLE RESISTOR β
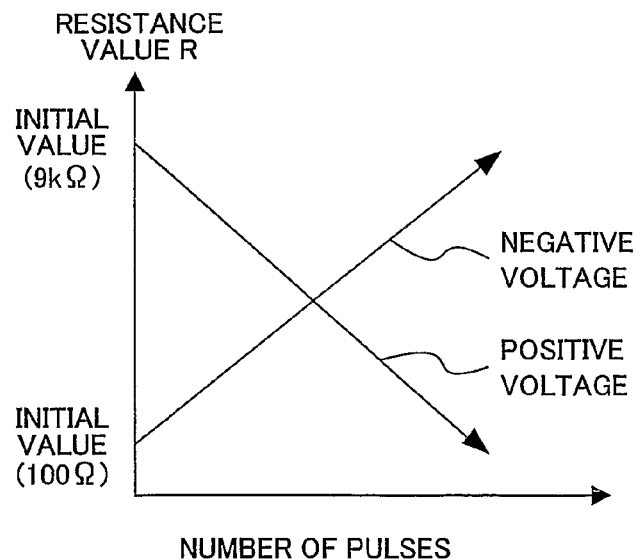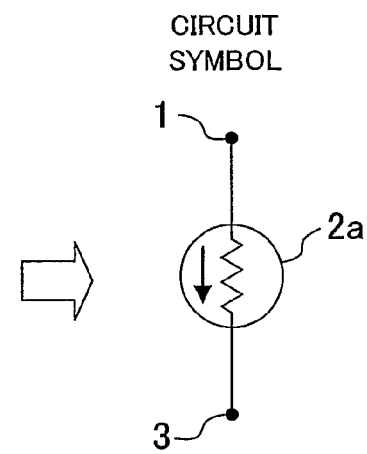

FIG. 4
(a) RECORDING
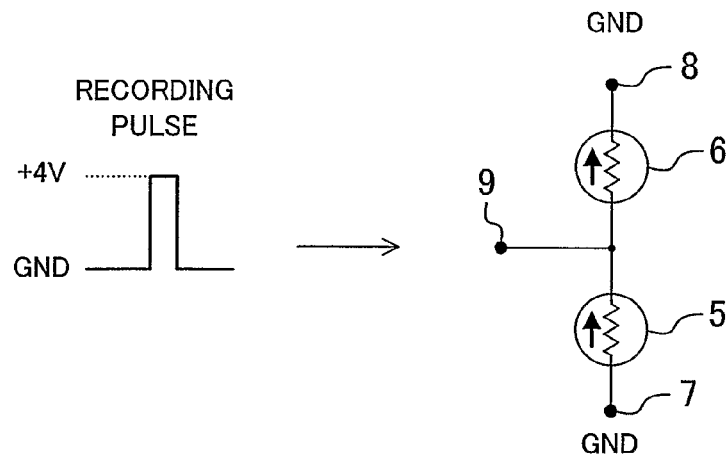
(b) RESISTANCE CHANGE OF VARIABLE RESISTOR
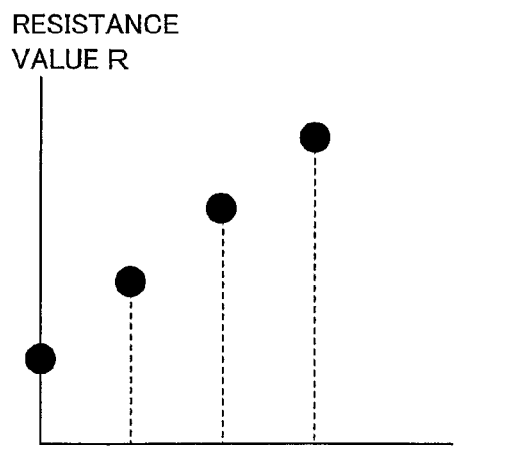
<RESISTANCE CHANGE OF VARIABLE RESISTOR 5>
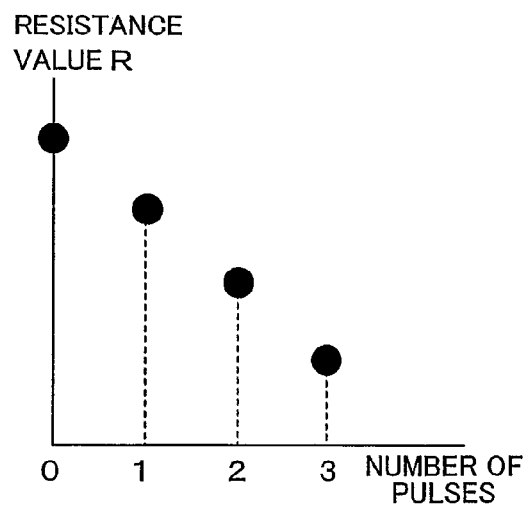
<RESISTANCE CHANGE OF VARIABLE RESISTOR 6>

FIG. 5
(a) REPRODUCTION
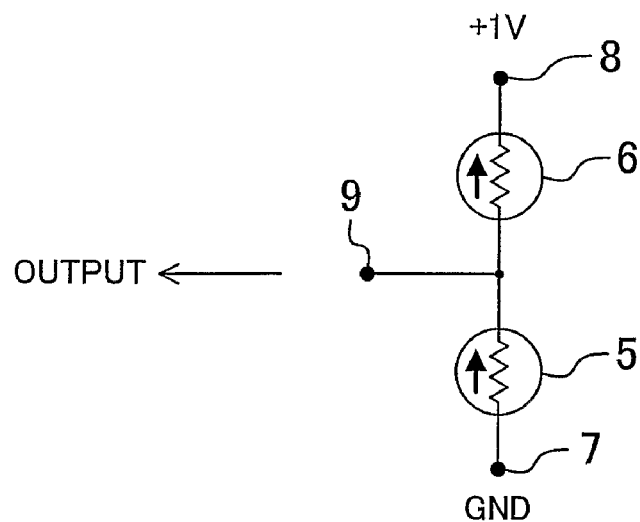
(b) REPRODUCTION OUTPUT VOLTAGE
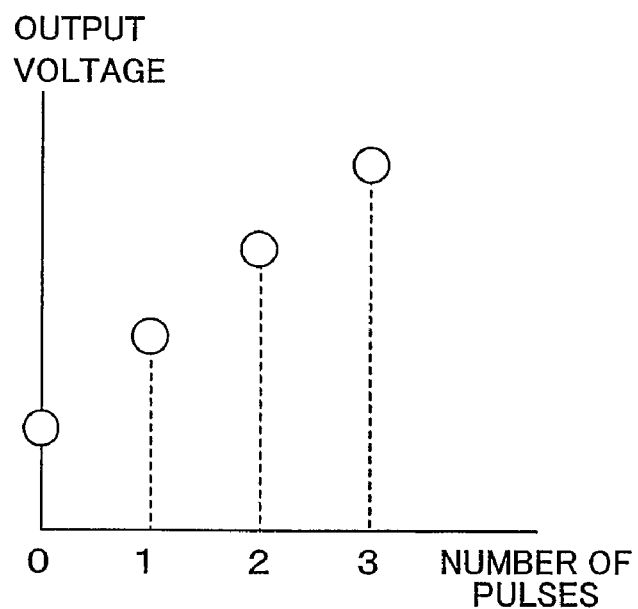

FIG. 6
(a) RESETTING
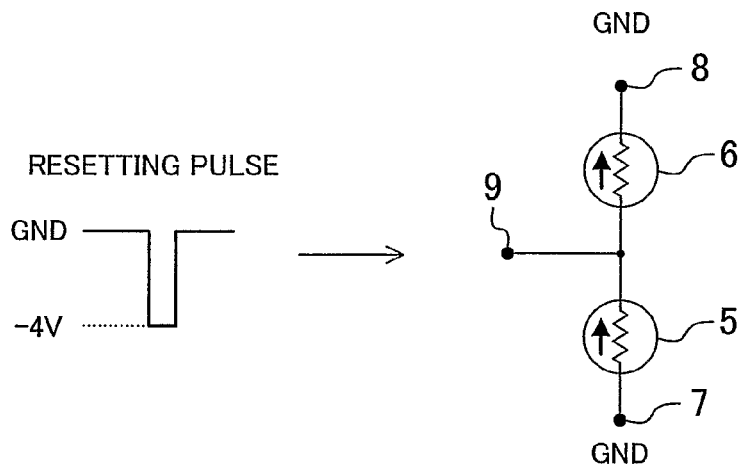
(b) RESISTANCE CHANGE OF VARIABLE RESISTOR
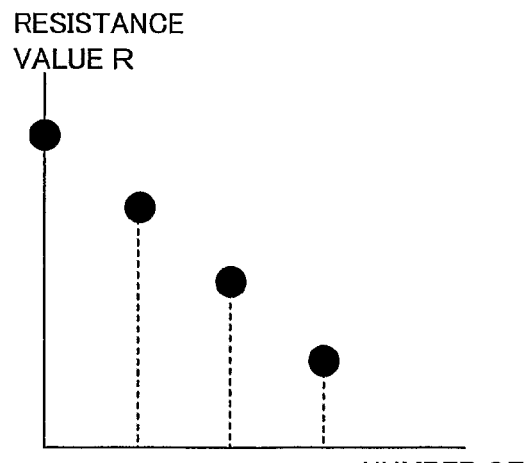
<RESISTANCE CHANGE OF VARIABLE RESISTOR 5>
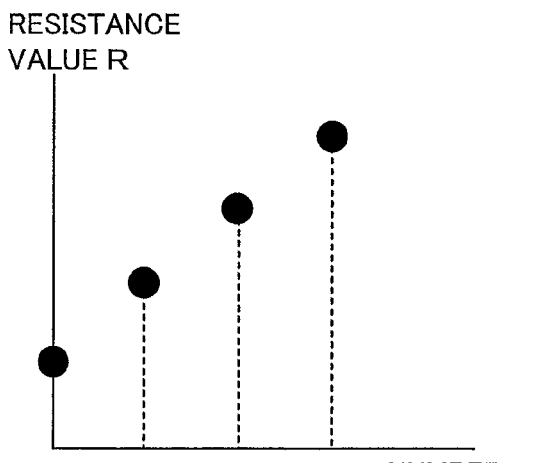
<RESISTANCE CHANGE OF VARIABLE RESISTOR 6>

FIG. 7
(a) RECORDING
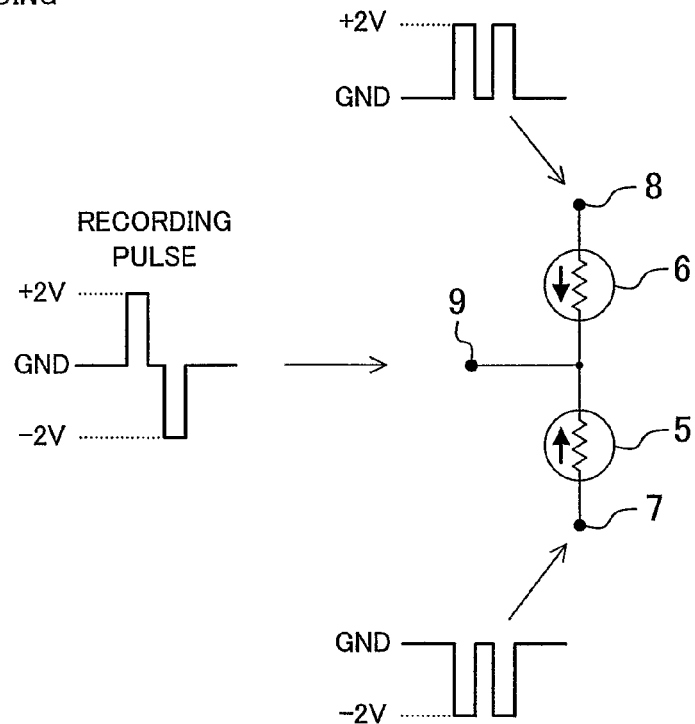
(b) RESISTANCE CHANGE OF VARIABLE RESISTOR
<RESISTANCE CHANGE OF
VARIABLE RESISTOR 5>
<RESISTANCE CHANGE OF
VARIABLE RESISTOR 6>

FIG. 10
(a) 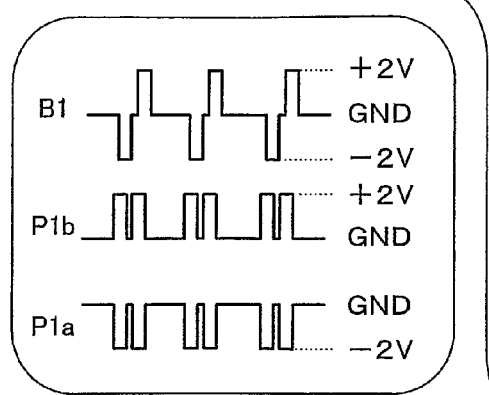
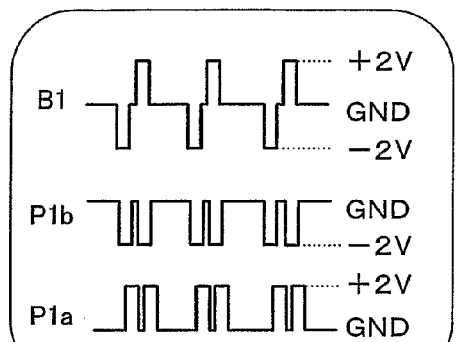
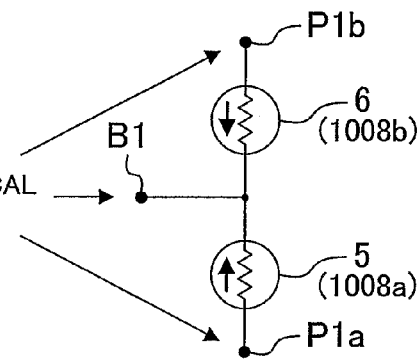
(b) 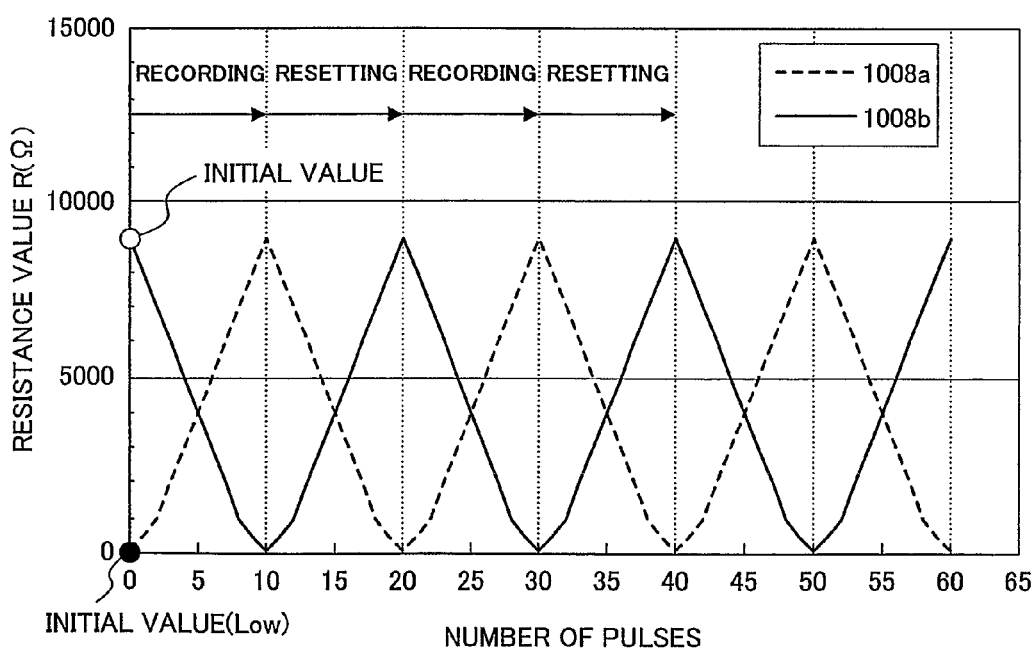

FIG. 11
(a) RESISTANCE CHANGE WITH NUMBER OF PULSES
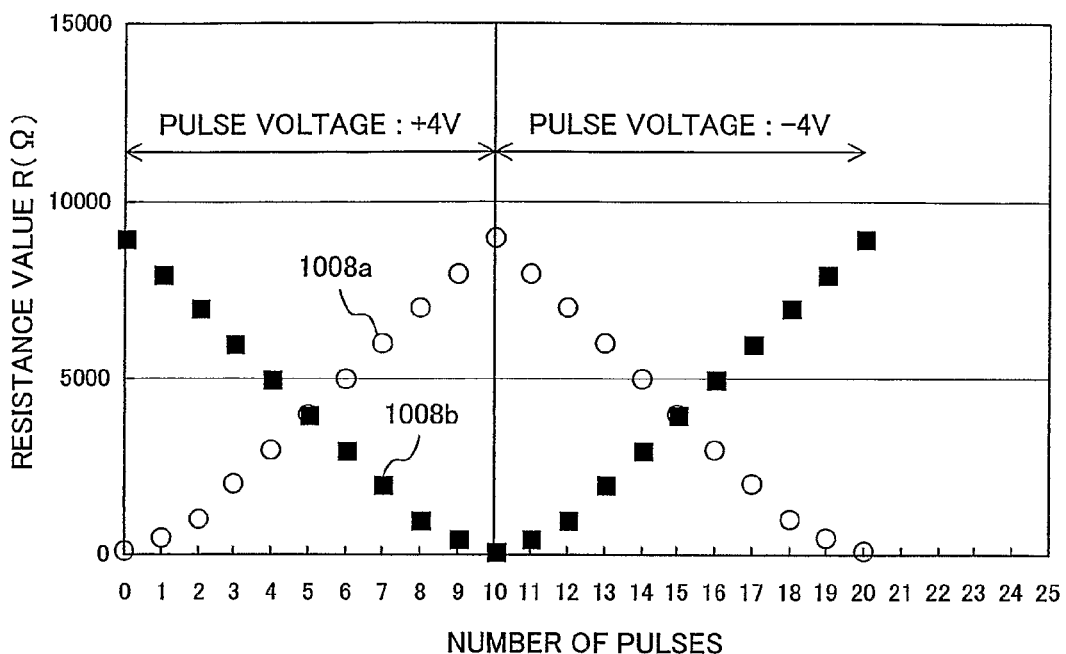
(b) OUTPUT VOLTAGE IN READOUT OF RECORDING STATE
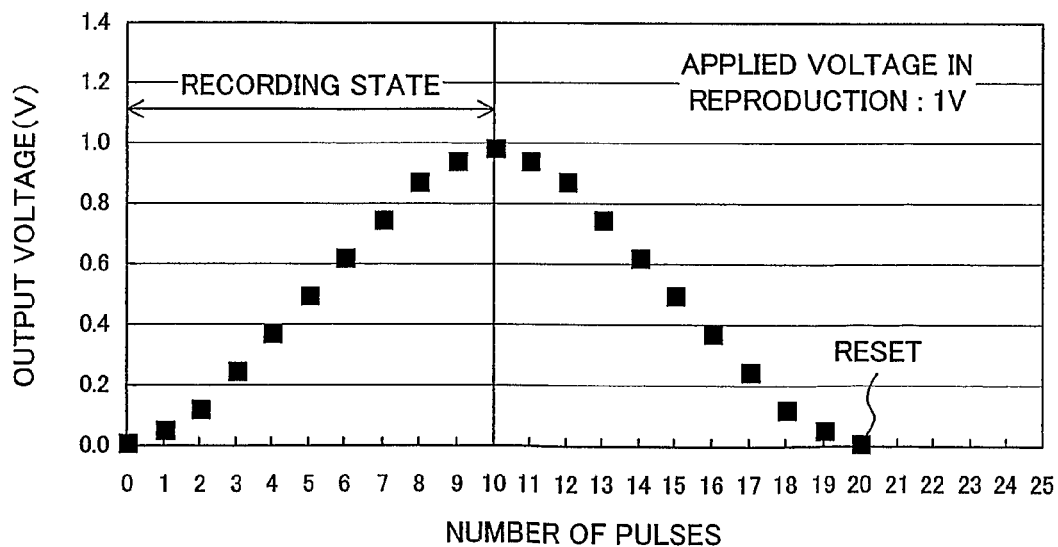

FIG. 12
(a) RESISTANCE CHANGE WITH NUMBER OF PULSES
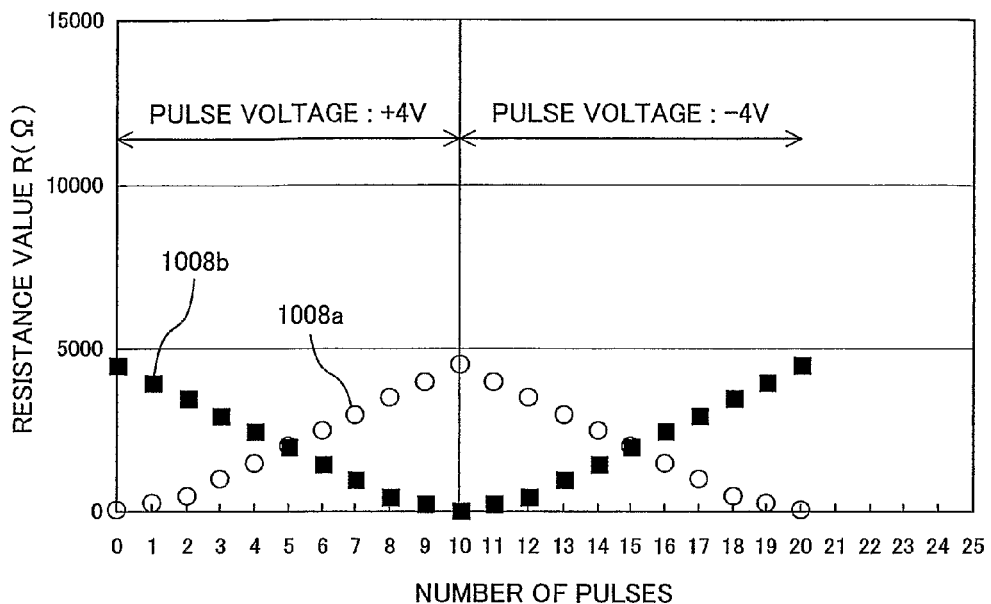
(b) OUTPUT VOLTAGE IN READOUT OF RECORDING STATE
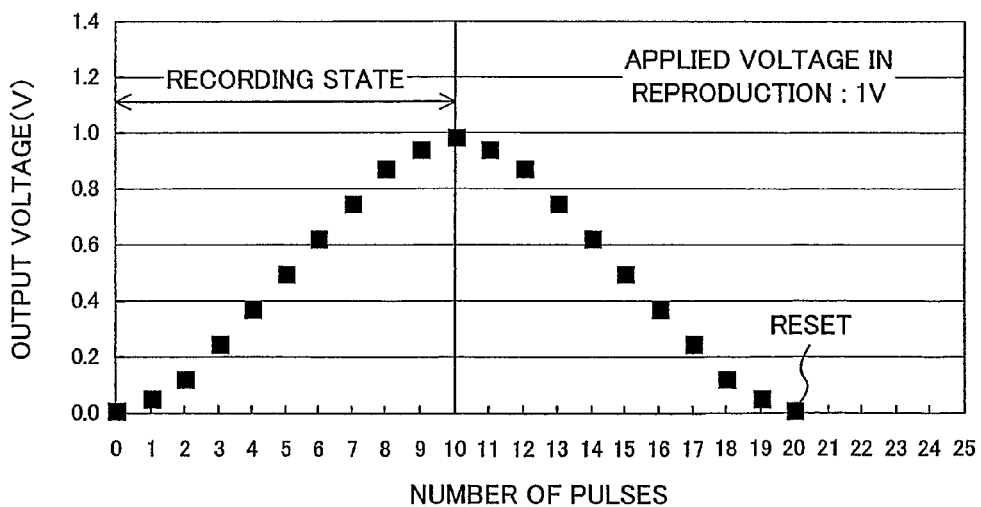

FIG. 15
(a)
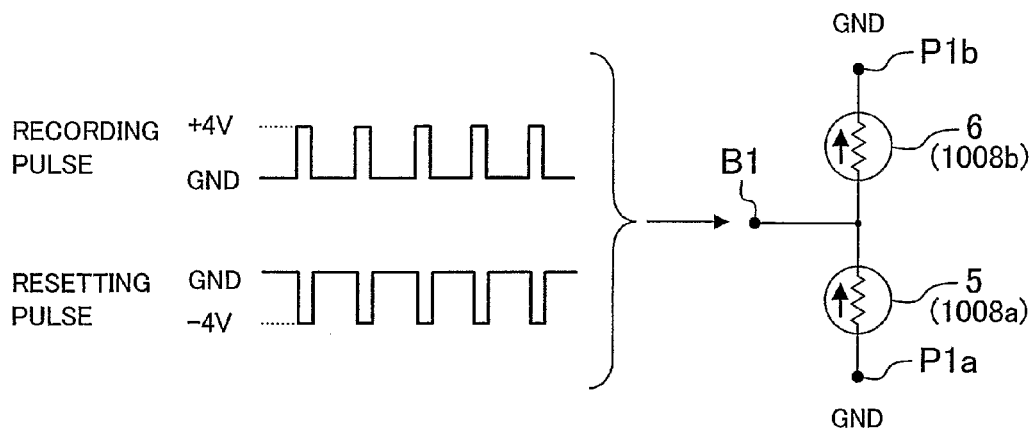
(b)
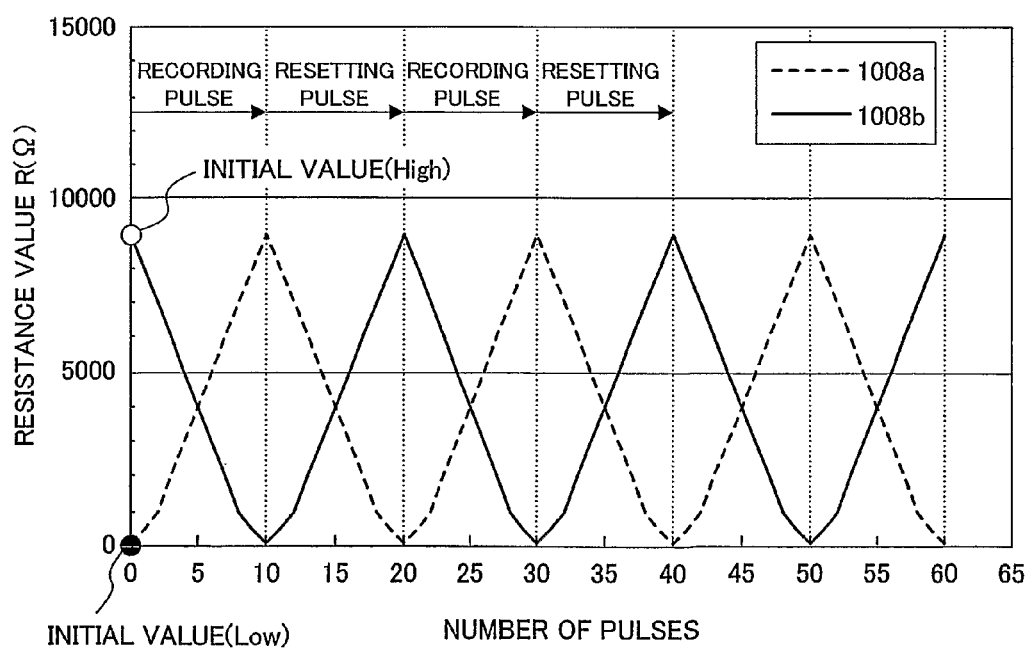

FIG. 29
(a) READOUT OF DATA "0"
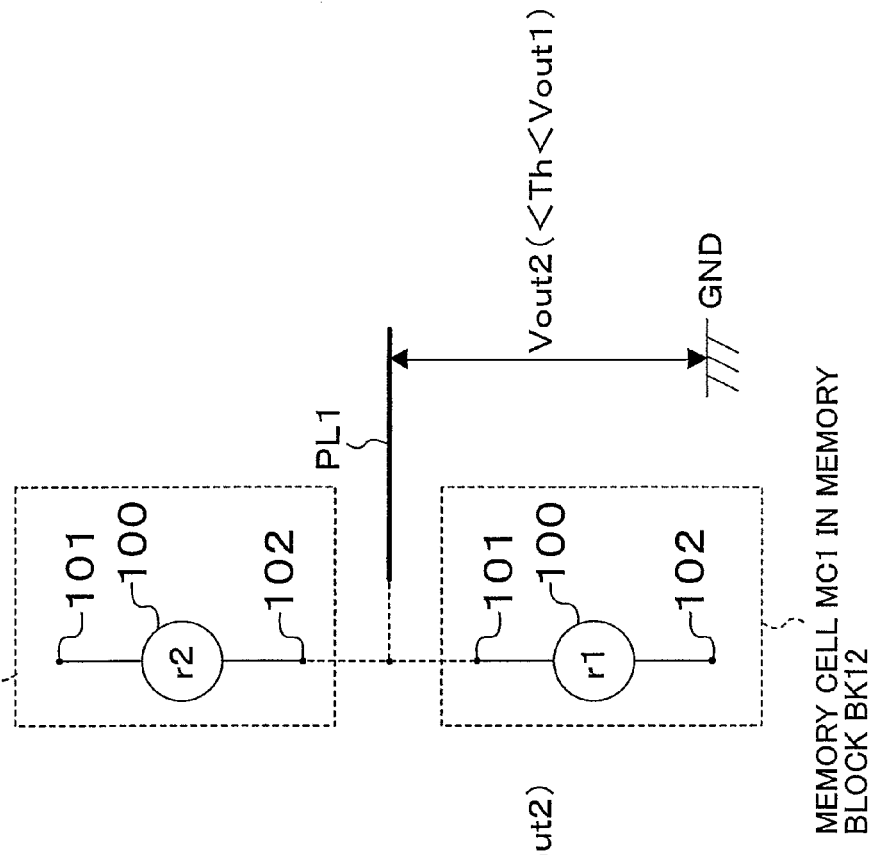
(b) READOUT OF DATA "1"
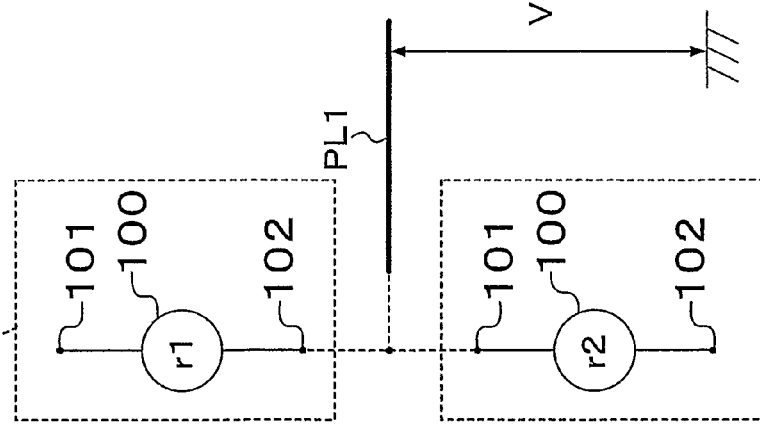

10. # MEMORY DEVICE, MEMORY CIRCUIT AND SEMICONDUCTOR INTEGRATED CIRCUIT HAVING VARIABLE RESISTANCE

RELATED APPLICATION

This application is a national phase of PCT/JP2004/016082 filed on Oct. 22, 2004, which claims priority from Japanese Application No. 2003-435269 filed on Dec. 26, 2003, Japanese Application No. 2004-131542 filed on Apr. 27, 2004, and Japanese Application No. 2004-167223 filed on Jun. 4, 2004, the disclosures of which Applications are incorporated by reference herein. The benefit of the filing and priority dates of the International and Japanese Applications is respectfully requested.

TECHNICAL FIELD

The present invention relates to a memory device, a memory circuit and a semiconductor integrated circuit, each using a material whose resistance changes depending on an electrical pulse applied thereto.

BACKGROUND

With recent development of digital technology for electric equipment, requirements for nonvolatile memories have been increasing in order to store data such as images. Specifically, requirements for larger capacity of memories, reduction of power necessary for writing, higher write/read speed, longer life and others have been further increasing. At present, flash memories that achieve no volatility by utilizing a mechanism in which electrons are injected into a floating gate provided at the gate of a semiconductor transistor are in practical use as nonvolatile memories and are widely used as external memories for digital cameras and personal computers.

However, such flash memories have many drawbacks, e.g., high write power, long write time, short rewritable life and difficulty in increasing the capacity (device miniaturization). Therefore, to overcome these drawbacks of flash memories, new nonvolatile memories such as a semiconductor memory (FeRAM) using a ferroelectric material, a semiconductor memory (MRAM) using a TMR (tunnel MR) material, a semiconductor memory (OUM) using a phase-change material have been actively developed to date. Nevertheless, these memories also have drawbacks, e.g., difficulty in device miniaturization for the FeRAM, high write power for the MRAM and short rewritable life for the OUM. Until now, no memories satisfy all the requirements for nonvolatile solid-state memories. As a recording method to overcome the drawbacks, a technique of changing the resistance value of an oxide with a parasite structure by utilizing a pulse voltage was invented by Houston University (U.S. Pat. No. 6,204,139). However, this technique still has great difficulties in obtaining stable operation as a memory and high mass-production yield.

SUMMARY

According to an aspect of the invention, a memory device includes a first variable resistor and a second variable resistor. The first and second variable resistors are connected in series between a first terminal and a second terminal. The first variable resistor is connected between the first terminal and a third terminal and the resistance value of the first variable resistor increases/decreases in accordance with the polarity of a pulse voltage applied between the first terminal and the third terminal. The second variable resistor is connected between the third terminal and the second terminal and the resistance value of the second variable resistor increases/decreases in accordance with the polarity of a pulse voltage applied between the third terminal and the second terminal.

In the memory device, given pulse voltages are applied between the first terminal and the third terminal and between the third terminal and the second terminal to reversibly change the resistance values of the respective first and second variable resistors, thereby recording one bit or multiple bits of information.

On the other hand, if a voltage at the third terminal is output with a first potential applied to the first terminal and a second potential applied to the second terminal, one bit or multiple bits of information is reproduced.

According to another aspect of the present invention, a memory device is configured using a material (variable-resistance material) whose resistance value changes depending on an electrical pulse applied thereto in the following manner.

A transistor having a source, a drain and a gate is formed on a semiconductor substrate. A protective insulating layer is formed over the transistor. A conductive layer is formed on the protective insulating layer. A variable resistance layer made of the variable-resistance material is formed on the conductive layer. Two electrodes are formed on the variable resistance layer. A contact plug for electrically connecting one of the drain and source of the transistor to the conductive layer is provided.

In this memory device, an application of an electrical pulse between the electrodes and the conductive layer changes the resistance values of portions (variable resistance portions) of the variable resistance layer located directly under the respective electrodes. In this manner, the variable resistance portions have a plurality of resistance states. If the respective resistance states are associated with numerical values, one bit or multiple bits of information can be stored. In addition, the transistor serves as a switch, so that the memory device is used as a memory cell.

With this memory device, a nonvolatile solid-state memory device without drawbacks such as high write power, long write time, short rewritable life and difficulty in increasing the capacity (device miniaturization), which are drawbacks in conventional nonvolatile solid-state memory devices, is implemented.

According to still another aspect of the present invention, a memory circuit includes: a first memory block; a second memory block; and a first block-selecting transistor. The first memory block is connected between a first node and a second node. The first block-selecting transistor is connected in series with the first memory block between the first node and the second node. The second memory block is connected between a third node and an interconnect node connecting the first memory block and the first block-selecting transistor to each other. Each of the first and second memory blocks includes a plurality of memory cells connected in series. Each of the plurality of memory cells includes a variable resistor and a transistor. The variable resistor is connected between a first terminal and a second terminal and has its resistance value changed in response to an electrical pulse applied between the first terminal and the second terminal. The transistor is connected in parallel with the variable resistor between the first terminal and the second terminal.

According to yet another aspect of the present invention, a memory circuit includes: a first memory block; a first block-selecting transistor; a second memory block; and a second block-selecting transistor. The first memory block is connected between a first node and a second node. The first block-selecting transistor is connected in series with the first memory block between the first node and the second node. The second memory block is connected between the second node and a third node. The second block-selecting transistor is connected in series with the second memory block between the second node and the third node. Each of the first and second memory blocks includes a plurality of memory cells connected in series. Each of the plurality of memory cells includes a variable resistor and a transistor. The variable resistor is connected between a first terminal and a second terminal and has its resistance value changed in response to an electrical pulse applied between the first terminal and the second terminal. The transistor is connected in parallel with the variable resistor between the first terminal and the second terminal.

With this memory circuit, even with advanced miniaturization of semiconductors, fewer errors occur in recording and reproduction than in a memory device with a cross-point structure.

BRIEF DESCRIPTION OF DRAWINGS

FIG. 2 shows changes of the resistance value when pulse voltages are applied to the variable resistor shown in FIG. 1.

FIG. 3 shows resistance characteristics and circuit symbols of variable resistors.

FIG. 4 shows a configuration of a memory device according to a first embodiment, application of a voltage during recording and resistance changes of a variable resistor.

FIG. 5 shows application of a voltage in reproduction of the memory device of the first embodiment and a change of output in reproduction.

FIG. 6 shows application of a voltage during resetting of the memory device of the first embodiment and a resistance change of a variable resistor.

FIG. 7 shows an exemplary configuration of a memory device according to a second embodiment, application of a voltage during recording, and a resistance change of a variable resistor.

FIG. 10 shows changes in the resistance value of a variable resistor during recoding and resetting.

FIG. 11 shows a relationship between the resistance value of the variable resistance during a reproducing mode and an output voltage.

FIG. 12 is a relationship between the resistance value of a variable resistor and an output voltage in the case where the resistance value of the variable resistor is ½.

FIG. 15 shows changes in the resistance value of a variable resistor during recording and resetting.

FIG. 29 is a diagram for explaining read operation of the memory LSI shown in FIG. 25.

DETAILED DESCRIPTION

Figure 1:
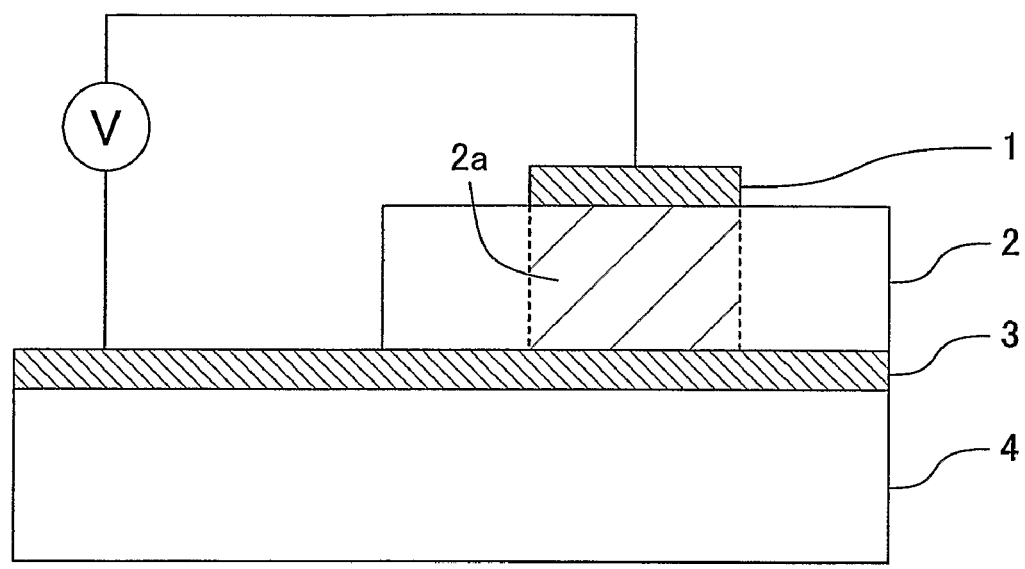
FIG. 1 is an exemplary basic structure of a variable resistor used in embodiments of the present invention.

Hereinafter, embodiments of the present invention will be specifically described with reference to the drawings. Like or corresponding parts are indicated by the same reference numerals and the descriptions thereof will not be repeated.

Basic Structure and Characteristics of Variable Resistor

First, a basic structure and basic characteristics of a variable resistor used in embodiments of the present invention will be described.

The variable resistor used in the embodiments has a characteristic of increasing/reducing its resistance value in accordance with the polarity of an applied electrical pulse. The basic structure thereof is shown in FIG. 1. In this variable resistor, an electrode 3 is provided on a substrate 4, a material 2 having a variable resistance is deposited on the electrode 3, and an electrode 1 is provided on the variable-resistance material 2. In this case, Si is used for the substrate 4, Pt is used for the electrode 3, a CMR material of $Pr_{0.7}Ca_{0.3}MnO_3$ (PCMO) is used as the variable-resistance material 2, and Ag is used as the electrode 1. It is reported in U.S. Pat. No. 6,204,139 that the PCMO material has a characteristic of changing (increasing/reducing) its resistance value depending on the number of pulses of an applied pulse voltage (a pulse voltage applied between the electrodes 1 and 3 in this case) and the direction of this change differs between the polarities of the applied voltage (the polarities of the pulse voltage applied between the electrodes 1 and 3 in this case). However, the initial state thereof is not mentioned in this patent. Hence, we examined how the resistance changes based on the number of pulses when pulse voltages of different polarities are applied to the PCMO material 2 deposited by sputtering at a substrate temperature of 700° C. A result of this examination is shown in FIG. 2.

FIG. 2(a) shows a change in resistance when a negative pulse voltage (voltage: −4V and pulse width: 10 ns) was applied (so as to set the electrode 1 to negative and the electrode 3 to positive) to the surface of the PCMO material 2 after deposition. A portion (variable resistance portion) 2a of the PCMO material 2 directly under the electrode 1 exhibited the following tendency. The portion 2a had a large resistance value R of about 30 kΩ after the deposition (in a state in which the number of applied pulse voltages was zero). As the number of pulses increased, the resistance value R decreased to be about 100 Ω after about 29 pulses had been applied. Then, the polarity was reversed and a positive pulse voltage (voltage: +4V and pulse width: 10 ns) was applied (so as to set the electrode 1 to positive and the electrode 3 to negative), so that the resistance value R increased and reached 9 kΩ at the 39th pulse. Thereafter, the polarity was reversed again and a negative pulse voltage (voltage: −4V and pulse width: 10 ns) was applied (so as to set the electrode 1 to negative and the electrode 3 to positive), so that the resistance value R decreased again. Accordingly, as shown in FIG. 3(*a*), a variable resistor α having the initial value of its resistance value R set at 100 kΩ or 9 kΩ through a process as shown in FIG. 2(*a*) has a characteristic in which the resistance value R increases by an application of a positive pulse voltage to the film surface (electrode 1) and decreases by an application of a negative pulse voltage. When a positive pulse voltage is applied to the film surface (electrode 1) with a resistance value R of 9 kΩ, the resistance value R does not increase anymore. When a negative pulse voltage is applied to the film surface (electrode 1) with a resistance value R of 100 Ω, the resistance value R does not decrease any more.

FIG. 2(*b*) shows a change in resistance when a positive pulse voltage (voltage: +4V and pulse width: 10 ns) was applied (so as to set the electrode 1 to positive and the electrode 3 to negative) to the surface of the PCMO material 2 after deposition. A portion (variable resistance portion) 2*a* of the PCMO material 2 directly under the electrode 1 exhibited the following tendency. The portion 2*a* had a large resistance value R of about 30 kΩ after the deposition (in a state in which the number of applied pulse voltages was zero). As the number of pulses increased, the resistance value R decreased to be about 100 Ω after about 29 pulses had been applied. Then, the polarity was reversed and a negative pulse voltage (voltage: −4V and pulse width: 10 ns) was applied (so as to set the electrode 1 to negative and the electrode 3 to positive), so that the resistance value R increased and reached 9 kΩ at the 39th pulse. Thereafter, the polarity was reversed again and a positive pulse voltage (voltage: +4V and pulse width: 10 ns) was applied (so as to set the electrode 1 to positive and the electrode 3 to negative), so that the resistance value R decreased again. Accordingly, as shown in FIG. 3(*b*), a variable resistor ρ having the initial value of its resistance value set at 100 Ω or 9 kΩ through a process as shown in FIG. 2(*b*) has a characteristic in which the resistance value R increases by an application of a negative pulse voltage to the film surface (electrode 1) and decreases by an application of a positive pulse voltage. When a negative pulse voltage is applied to the film surface (electrode 1) with a resistance value R of 9 kΩ, the resistance value R does not increase any more. When a positive pulse voltage is applied to the film surface (electrode 1) with a resistance value R of 100 Ω, the resistance value R does not decrease any more.

In this example, the polarity of a pulse voltage is defined as the polarity of a voltage applied to the film surface (electrode 1) of the PCMO material 2 for convenience. However, in description with a circuit diagram, the definitions of "front" and "back" of the material are not effective. Therefore, if the variable resistors used in the foregoing description are represented by circuit symbols as shown in FIG. 3, both characteristics of the variable resistors α and β are explained at the same time. Specifically, a circuit symbol representing a variable resistor is defined in such a manner that the resistance value increases when a positive pulse voltage is applied to the tip of the arrow and the resistance value deceases when a negative pulse voltage is applied to the tip of the arrow. With this definition, the variable resistors α and β are represented by exactly the same symbol. Thus, a variable resistor is herein represented by the circuit symbol shown in FIG. 3.

EMBODIMENT 1

Configuration of Memory Device

FIG. 4(*a*) shows a configuration of a memory device according to a first embodiment of the present invention. In the memory device, variable resistors 5 and 6 whose resistance values vary depending on the polarity of an electrical pulse applied thereto are connected in series between a power supply terminal 7 and a power supply terminal 8. An input/output terminal 9 is connected to an interconnect node connecting the variable resistors 5 and 6. The variable resistor 5 has its initial resistance value set at 100 Ω through the initialization process described with reference to FIGS. 2 and 3. The resistance value of the variable resistor 5 increases when a pulse voltage for setting the input/output terminal 9 to positive is applied between the input/output terminal 9 and the power supply terminal 7 whereas the resistance thereof value decreases when a pulse voltage for setting the input/output terminal 9 to negative is applied. The variable resistor 6 has its initial resistance value set at 9 kΩ through the initialization process described with reference to FIGS. 2 and 3. The resistance value of the variable resistor 6 increases when a pulse voltage for setting the power supply terminal 8 to positive is applied between the power supply terminal 8 and the input/output terminal 9 whereas the resistance value thereof decreases when a pulse voltage for setting the power supply terminal 8 to negative is applied.

Recording of Information in Memory Device

To record information in the above-mentioned memory device, as shown in FIG. 4(*a*), a recording pulse voltage (voltage: +4V and pulse width: 10 ns) is applied to the input/output terminal 9 with a ground voltage GND applied to the power supply terminals 7 and 8. In this case, a positive pulse voltage is applied to the tip of the arrow of the variable resistor 5 (i.e., to the input/output terminal 9) and a negative pulse voltage is applied to the tip of the arrow of the variable resistor 6 (i.e., to the power supply terminal 8). As a result, as shown in FIG. 4(*b*), as the number of applied pulses increases, the resistance value R of the variable resistor 5 increases and the resistor R of the variable resistor 6 decreases. By thus applying pulse voltages, the resistance values R of the two variable resistors 5 and 6 are changed to the respective directions opposite to their initial values, thereby recording information. Suppose a state in which the number of applied pulses is zero is (0, 0), a state in which the number of pulses is one is (0, 1), a state in which the number of pulses is two is (1, 0) and a state in which the number of pulses is three is (1, 1), the resistance values R shift from one state to another among the four states in accordance with the number of pulses, so that two bits of multivalve information are recorded.

Reproduction of Information from Memory Device

The variable-resistance material 2 (FIG. 1) also has a characteristic in which the resistance value of the variable resistance portion 2*a* does not change when the absolute value (amplitude) of an applied voltage is at a given level or lower. Accordingly, if a voltage at the given level or lower is applied to the variable resistance portion 2*a*, it is possible to measure the resistance value of the variable resistance portion 2*a*. By utilizing this, information is reproduced from the memory device shown in FIG. 4.

FIG. 5(a) shows reproduction of information recorded in the memory device shown in FIG. 4. In this reproduction, a ground voltage GND is applied to the power supply terminal 7 and a reproducing voltage (e.g., +1V) lower than the recording pulse voltage is applied to the power supply terminal 8. Then, the output voltage is taken out from the input/output terminal 9. This output voltage is shown in FIG. 5(b). The output voltage takes different values depending on the number of pulses in recording, so that two bits of multivalve information are reproduced.

Reset of Recording State

FIG. 6(a) shows reset of the recording state of the memory device. In this reset, a ground voltage GND is applied to the power supply terminals 7 and 8 and a resetting pulse voltage (voltage: −4V: and pulse width: 10 ns) of negative polarity, which is opposite to that in recording, is applied to the input/output terminal 9. In this case, a negative pulse voltage is applied to the tip of the arrow of the variable resistor 5 (i.e., to the input/output terminal 9) and a positive pulse voltage is applied to the tip of the arrow of the variable resistor 6 (i.e., to the power supply terminal 8). As a result, as shown in FIG. 6(b), as the number of pulses increases, the resistance value R of the variable resistor 5 decreases and the resistance value R of the variable resistor 6 increases. By applying the same number of pulses as those in recording, the resistance values R of the variable resistors 5 and 6 are reset to the values in their initial states.

MODIFIED EXAMPLE

In the memory device shown in FIG. 4(a), the following pulse voltages may be applied during recording and resetting.

In recording information in the memory device, a recording pulse voltage (voltage: +2V and pulse width: 10 ns) is applied to the input/output terminal 9 and a pulse voltage (voltage: −2V and pulse width: 10 ns) of polarity opposite to that of the recording pulse is applied to the power supply terminals 7 and 8 in synchronization with the recording pulse. In this case, a positive pulse voltage (+4V) is applied to the tip of the arrow of the variable resistor 5 (i.e., to the input/output terminal 9) and a negative pulse voltage (−4V) is applied to the tip of the arrow of the variable resistor 6 (i.e., to the power supply terminal 8). As a result, the resistances change in a similar manner to that shown in FIG. 4(b).

In reset, a resetting pulse voltage (voltage: −2V and pulse width: 10 ns) of negative polarity opposite to that in recording is applied to the input/output terminal 9 and a pulse voltage (voltage: +2V and pulse width: 10 ns) of polarity opposite to that of the resetting pulse is applied to the power supply terminals 7 and 8 in synchronization with the resetting pulse. In this case, a negative pulse voltage (−4V) is applied to the tip of the arrow of the variable resistor 5 (i.e., to the input/output terminal 9) and a positive pulse voltage (+4V) is applied to the tip of the arrow of the variable resistor 6 (i.e., to the power supply terminal 8). As a result, the resistances change in a similar manner to that shown in FIG. 6(b).

EMBODIMENT 2

Configuration of Memory Device

FIG. 7(a) shows a configuration of a memory device according to a second embodiment of the present invention. A variable resistor 6 in this memory device has its initial resistance value set at 9 kΩ through the initialization process described with reference to FIGS. 2 and 3. The resistance value of the variable resistor 6 decreases when a pulse voltage for setting a power supply terminal 8 to positive is applied between the power supply terminal 8 and an input/output terminal 9 and the resistance value thereof increases when a pulse voltage for setting the power supply terminal 8 to negative is applied. The other part of the configuration is similar to that shown in FIG. 4(a).

Recording of Information in Memory Device

To record information in this memory device, as shown in FIG. 7(a), a recording pulse voltage having a positive pulse (voltage: +2V and pulse width: 10 ns) and a negative pulse (voltage: −2V and pulse width: 10 ns) is applied to the input/output terminal 9, a pulse voltage having two negative pulses (each pulse voltage: −2V and each pulse width: 10 ns) is applied to a power supply terminal 7 in synchronization with the recording pulse voltage, and a pulse voltage having two positive pulses (each pulse voltage: +2V and each pulse width: 10 ns) is applied to the power supply terminal 8 in synchronization with the recording pulse voltage. Accordingly, a positive pulse voltage (+4V) is applied to the tip of the arrow of the variable resistor 5 (i.e., to the input/output terminal 9) and a negative pulse voltage (−4V) is applied to the tip of the arrow of the variable resistor 6 (i.e., to the power supply terminal 8). As a result, as shown in FIG. 7(b), as the number of applied pulses increases, the resistance value R of the variable resistor 5 increases and the resistor R of the variable resistor 6 decreases. By applying pulse voltages in this manner, the resistance values R of the two variable resistors 5 and 6 are changed to the respective directions opposite to their initial values, thereby recording information.

Reproduction of Information from Memory Device

As in the first embodiment, in reproduction, a ground voltage GND is applied to the power supply terminal 7 and a reproducing voltage (e.g., +1V) lower than the recording pulse voltage is applied to the power supply terminal 8. Then, the output voltage is taken out from the input/output terminal 9. This output voltage is similar to that shown in FIG. 5(b).

Reset of Recording State

To reset the recording state of the memory device, a resetting pulse voltage having a positive pulse (voltage: +2V and pulse width: 10 ns) and a negative pulse (voltage: −2V and pulse width: 10 ns) is applied to the input/output terminal 9, a pulse voltage having two positive pulses (each pulse voltage: +2V and each pulse width: 10 ns) is applied to the power supply terminal 7 in synchronization with the resetting pulse voltage, and a pulse voltage having two negative pulses (each pulse voltage: −2V and each pulse width: 10 ns) is applied to the power supply terminal 8 in synchronization with the recording pulse voltage. Accordingly, a negative pulse voltage (−4V) is applied to the tip of the arrow of the variable resistor 5 (i.e., to the input/output terminal 9) and a positive pulse voltage (+4V) is applied to the tip of the arrow of the variable resistor 6 (i.e., to the power supply terminal 8). As a result, in a similar manner to that shown in FIG. 6(b), as the number of applied pulses increases, the resistance value R of the variable resistor 5 decreases and the resistance value R of the variable resistor 6 increases. By thus applying the same number of pulse voltages as those in recording, the resistance values R of the variable resistors 5 and 6 are reset to their respective initial states.

EMBODIMENT 3

Circuit Configuration of Memory Array Circuit

Figure 8:
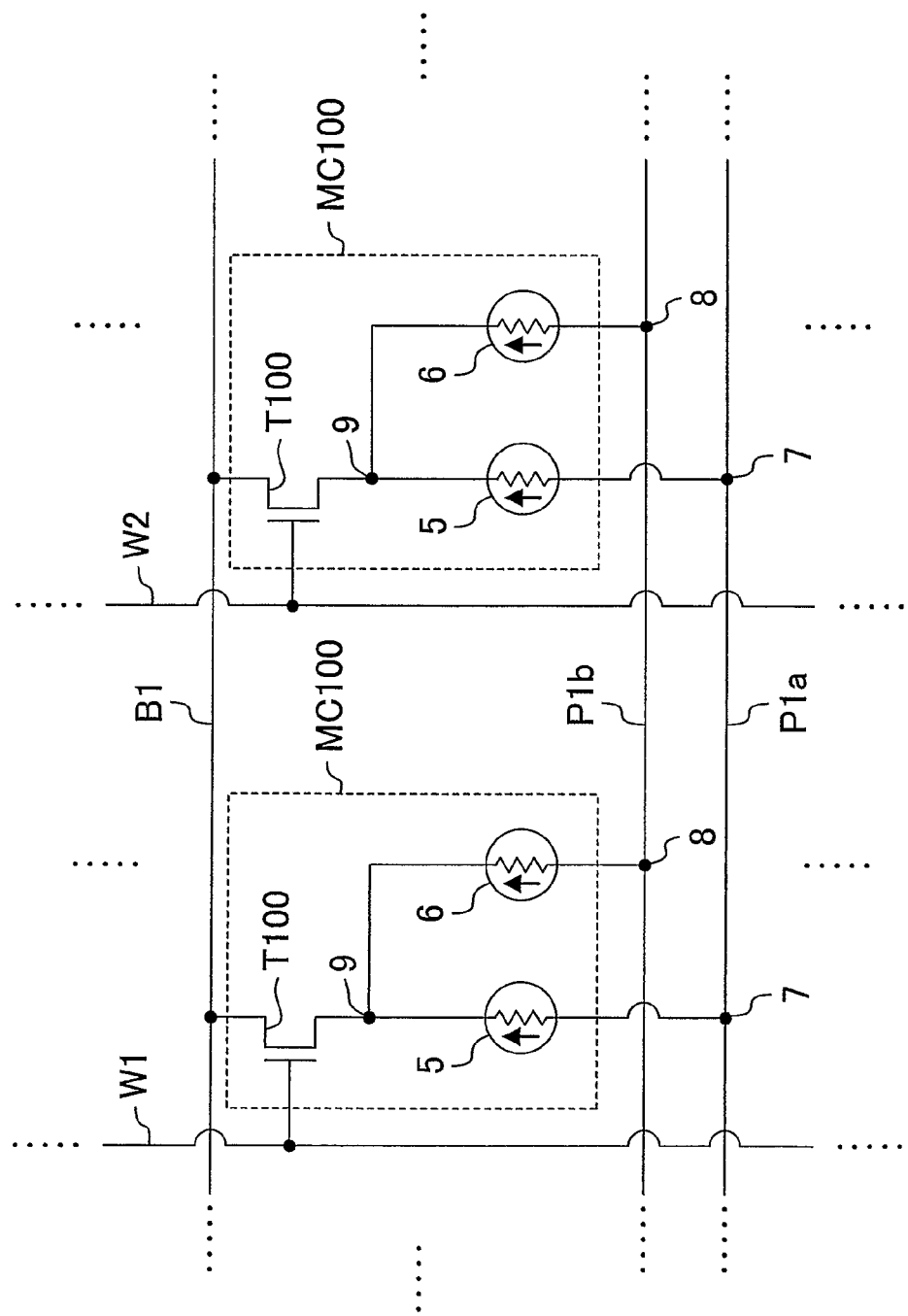
FIG. 8 is an exemplary circuit diagram showing a configuration of a memory array circuit according to a third embodiment.

A circuit configuration of a memory array circuit according to a third embodiment is shown in FIG. 8. This memory array circuit is an example in which the memory device described in the second embodiment (FIG. 7) is incorporated in a transistor circuit. In the memory array circuit, a plurality of memory cells MC100 are arranged in rows and columns, i.e., in a matrix pattern. A plurality of word lines W1, W2, . . . are arranged in columns. A plurality of bit lines B1, . . . are arranged in rows. A plurality of plate lines P1a, P1b, . . . are also arranged in rows. Out of the plurality of memory cells MC100 included in the memory array circuit, FIG. 8 shows a portion including two memory cells MC100 associated with the word lines W1 and W2, the bit line B1 and the plate lines P1a and P1b.

Each of the memory cells MC100 includes variable resistors 5 and 6 and a transistor T100. The transistor T100 and the variable resistor 5 are connected in series between the associated bit line B1 and the associated plate line P1a. The transistor T100 has its gate connected to the associated word line W1 or W2. The variable resistor 6 is connected between an interconnect node connecting the transistor T100 and the variable resistor 5 and the associated plate line P1b. In association with the memory device shown in FIG. 7(a), the input/output terminal 9 is connected to the drain (or source) of the transistor T100, the power supply terminal 7 is connected to the plate line P1a, and the power supply terminal 8 is connected to the plate line P1b. The variable resistor 5 has its initial resistance value set at 100 Ω through the initialization process described with reference to FIGS. 2 and 3. The resistance value of the variable resistor 5 increases when a pulse voltage for setting the input/output terminal 9 to positive is applied between the input/output terminal 9 and the power supply terminal 7 and the resistance value thereof decreases when a pulse voltage for setting the input/output terminal 9 to negative is applied. The variable resistor 6 has its initial resistance value set at 9 kΩ through the initialization process described with reference to FIGS. 2 and 3. The resistance value of the variable resistor 6 increases when a pulse voltage for setting the input/output terminal 9 to positive is applied between the input/output terminal 9 and the power supply terminal 8 and the resistance value decreases when a pulse voltage for setting the input/output terminal 9 to negative is applied.

Cross-sectional Structure of Memory Array Circuit

Figure 9:
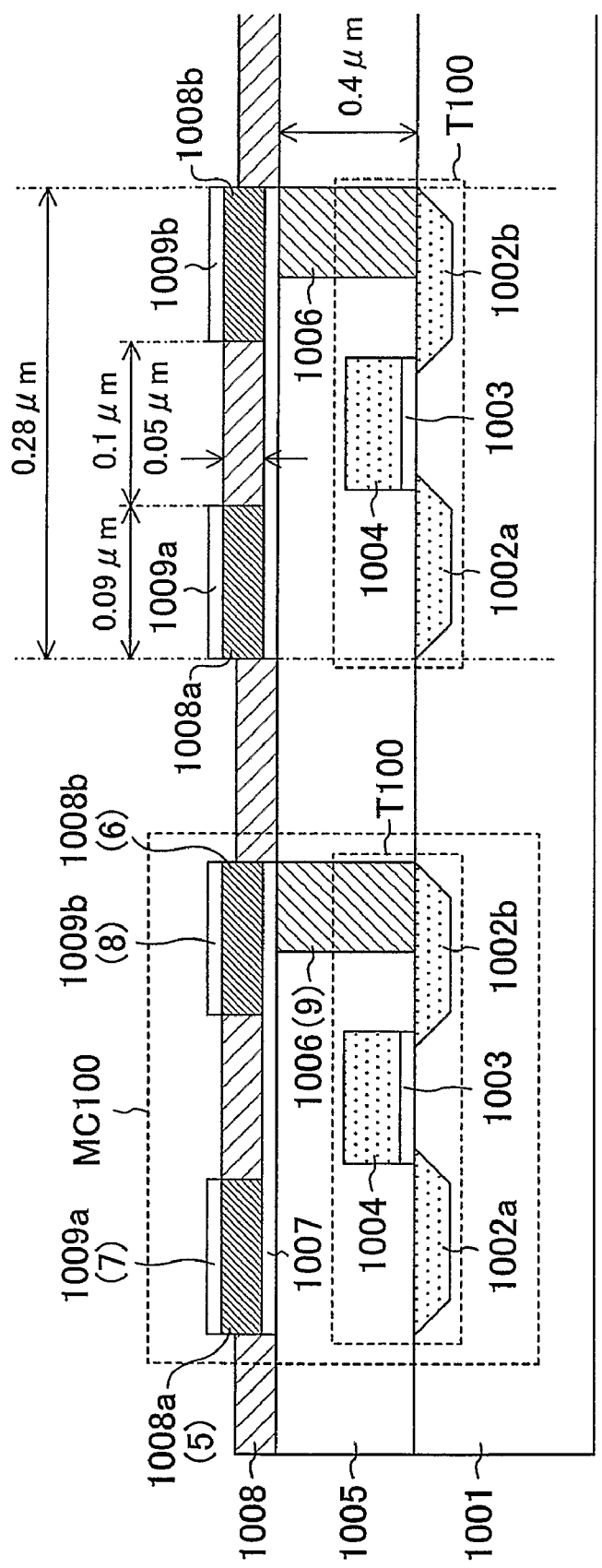
FIG. 9 shows an exemplary cross-sectional structure of the memory array circuit shown in FIG. 8.

FIG. 9 shows a cross-sectional structure of the memory array circuit shown in FIG. 8. In this memory array circuit, a memory cell MC100 is configured in the following manner. First, a drain 1002a and a source 100b2 are formed in a semiconductor substrate 1001, and a gate 1004 is formed over the substrate 1001 with a gate oxide film 1003 interposed there between. These components constitute a transistor T100. The transistor T100 is covered with a protective insulating film 1005. A conductive film 1007 is formed on the protective insulating film 1005. A variable resistance film 1008 is formed by sputtering over the conductive film 1007. The conductive film 1007 and the source 100b2 are connected to each other via a contact plug 1006. Two electrodes 1009a and 1009b are formed on the variable resistance film 1008. In this way, the memory cell MC100 is configured.

When a given pulse voltage is applied between the electrode 1009a and the conductive film 1007, the resistance value of a portion (variable resistance portion 1008a) of the variable resistance film 1008 directly under the electrode 1009a increases/decreases. When a given pulse voltage is applied between the electrode 1009b and the conductive film 1007, the resistance value of a portion (variable resistance portion 1008b) of the variable resistance film 1008 directly under the electrode 1009b increases/decreases. In this memory cell MC100, the variable resistance portions 1008a and 1008b are used as one memory device so that one or more bits of information (bit data) is stored by utilizing changes of the resistances of the variable resistance portions 1008a and 1008b.

In association with FIG. 8, the drain 1002a is connected to the bit line B1. The gate 1004 is connected to the word line W1 or W2. The contact plug 1006 corresponds to the input/output terminal 9. The portion (the variable resistance portion 1008a) of the variable resistance film 1008 directly under the electrode 1009a corresponds to the variable resistor 5. The portion (the variable resistance portion 1008b) of the variable resistance film 1008 directly under the electrode 1009b corresponds to the variable resistor 6.

Size

The protective insulating film 1005 need only be thick enough to prevent the gate 1004 and the conductive film 1007 from being electrically connected. The conductive film 1007 need only be at least wide enough to allow the contact plug 1006 and the variable resistance portions 1008a and 1008b to be electrically connected. The electrodes 1009a and 1009b need only be formed on a portion within the width of the conductive film 1007. In this way, electric fields are generated between the conductive film 1007 and the electrodes 1009a, 1009b. The electrodes 1009a and 1009b need only be located at a distance enough to prevent an electric field generated between the electrode 1009a and the conductive film 1007 from having an effect on the electrode 1009b. In this way, pulse voltages are individually applied to the variable resistance portions 1008a and 1008b.

In this embodiment, the width of each memory cell MC100 shown in FIG. 9 is 0.28 μm, the thickness of the variable resistance film 1008 is 0.05 μm, the thickness of the protective insulating film 1005 is 0.4 μm, the width of each of the electrodes 1009a and 1009b is 0.09 μm. The width of the conductive film 1007 is 0.28 μm, which is the same as that of the memory cell MC100. The distance between the electrodes 1009a and 1009b is 0.1 μm.

Materials Used

In this embodiment, a CMR material of $Pr_{0.7}Ca_{0.3}MnO_3$ (PCMO) is used for the variable resistance film 1008, Pt is used for the conductive film 1007, and Ag is used for the electrodes 1009a and 1009b. In addition, Si is used for the substrate 1001, $SiO_2$ is used for the gate oxide film 1003, poly-Si is used for the gate 1004, and W (tungsten) is used for the contact plug 1006.

Operation of Memory Array Circuit

The memory array circuit has a recording mode, a resetting mode and a reproducing mode and records binary or multi-valve information (bit data) in a memory cell MC100. Hereinafter, this will be described specifically.

Recording Mode

A recording mode in which information (bit data) is recorded in a memory cell MC100 shown in FIGS. 8 and 9 will be described with reference to FIGS. 10(a) and 10(b). The variable resistance portion 1008a (the variable resistor 5) has its initial resistance value set at 100 Ω through the initialization process described with reference to FIGS. 2 and 3. The resistance value thereof increases when a pulse voltage for setting the conductive film 1007 to positive is applied between the conductive film 1007 and electrode 1009*a* and the resistance value thereof decreases when a pulse voltage for setting the conductive film 1007 to negative is applied. The variable resistance portion 1008*b* (the variable resistor 6) has its initial value set at 9 kΩ through the initialization process described with reference to FIGS. 2 and 3. The resistance value thereof increases when a pulse voltage for setting the conductive film 1007 to positive is applied between the conductive film 1007 and the electrode 1009*b* and the resistance value thereof decreases when a pulse voltage for setting the conductive film 1007 to negative is applied.

First, synchronized pulse voltages are applied to two plate lines associated with a memory cell MC100 in which information is to be recorded. Specifically, a pulse voltage having two negative pulses (each pulse voltage: −2V and each pulse width: 10 ns) is applied to one of the two plate lines (P1*a* in this case), and a pulse voltage having two positive pulses (each pulse voltage: +2V and each pulse width: 10 ns) is applied to the other (P1*b* in this case).

Next, a given voltage is applied to a word line (W1 in this case) associated with the memory cell MC100 in which information is to be recorded, thereby bringing the transistor T100 into conduction.

Then, a pulse voltage having a positive pulse (voltage: +2V and pulse width: 10 ns) and a negative pulse (voltage: −2V and pulse width: 10 ns) is applied to a bit line (B1 in this case) associated with the memory cell MC100 in which information is to be recorded, in synchronization with the pulse voltages applied to the two plate lines (P1*a*, P1*b*).

The pulse voltage applied to the bit line B1 is applied to the variable resistance portions 1008*a* and 1008*b* via the transistor T100. The resistance value R of the variable resistance portion 1008*a* increases from 100 Ω to 9 kΩ in accordance with the applied pulse voltage, and the resistance value R of the variable resistance portion 1008*b* decreases from 9 kΩ to 100 Ω in accordance with the applied pulse voltage (from first through tenth pulses shown in FIG. 10(*b*)).

In this manner, the resistance values R of the variable resistance portions 1008*a* and 1008*b* increase/decrease stepwise in accordance with the number of applications of pulse voltages (the number of pulses) applied to the bit line B1, thereby writing information in the memory cell MC100. That is, the storage state is set in accordance with the resistance values R of the variable resistance portions 1008*a* and 1008*b*. For example, suppose a state in which the resistance value R of the variable resistance portion 1008*a* is 100 Ω corresponds to "0" and a state in which the resistance value R of the variable resistance portion 1008*a* is 9 kΩ corresponds to "1", binary information is stored.

Resetting Mode

A resetting mode in which information written in a memory cell M100 shown in FIGS. 8 and 9 will be described with reference to FIGS. 10(*a*) and 10(*b*). It is assumed that the resistance value R of the variable resistance portion 1008*a* is 9 kΩ and the resistance value R of the variable resistance portion 1008*b* is 100 Ω through the above recording mode (i.e., at the tenth pulse shown in FIG. 10(*b*)).

First, synchronized pulse voltages are applied to two plate lines associated with a memory cell MC100 from which information is to be erased. Specifically, a pulse voltage having two positive pulses (each pulse voltage: +2V and each pulse width: 10 ns) is applied to one of the two plate lines (P1*a* in this case), and a pulse voltage having two negative pulses (each pulse voltage: −2V and each pulse width: 10 ns) is applied to the other (P1*b* in this case).

Next, a given voltage is applied to a word line (W1 in this case) associated with the memory cell MC100 from which information is to be erased, thereby bringing the transistor T100 into conduction.

Then, a pulse voltage having a positive pulse (voltage: +2V and pulse width: 10 ns) and a negative pulse (voltage: −2V and pulse width: 10 ns) is applied to a bit line (B1 in this case) associated with the memory cell MC100 from which information is to be erased, in synchronization with the pulse voltages applied to the two plate lines (P1*a* and P1*b*).

The pulse voltage applied to the bit line B1 is applied to the variable resistance portions 1008*a* and 1008*b* via the transistor T100. The resistance value R of the variable resistance portion 1008*a* decreases from 9 kΩ to 100 Ω in accordance with the applied pulse voltage, and the resistance value R of the variable resistance portion 1008*b* increases from 100 Ω to 9 kΩ in accordance with the applied pulse voltage (from eleventh through twentieth pulses shown in FIG. 10(*b*)).

In this manner, if a pulse voltage of polarity opposite to that of a pulse voltage applied in the recording mode is applied to each of the variable resistance portions 1008*a* and 1008*b* the same number of times as in the recording mode, information written in a memory cell MC100 is reset. That is, the storage states of the variable resistance portions 1008*a* and 1008*b* are reset to their initial states.

If the foregoing recording mode and resetting mode are alternately repeated for 10 pulses at each time, the resistance values R of the variable resistance portions 1008*a* and 1008*b* change regularly as shown in FIG. 10(*b*).

Reproducing Mode

A reproducing mode in which information (bit data) written in a memory cell MC100 shown in FIGS. 8 and 9 is read out will be described.

First, a ground voltage GND is applied to one of the two plate lines (P1*a* in this case) associated with a memory cell MC100 from which information is to be read out.

Next, a given voltage is applied to a word line (W1 in this case) associated with the memory cell MC100 from which information is to be read out, thereby bringing the transistor T100 into conduction.

Then, a reproducing voltage V0 is applied to the other plate line (P1*b* in this case). Since it is necessary to keep the resistance values (storage states) of the respective variable resistance portions 1008*a* and 1008*b*, the absolute value (amplitude) of the applied reproducing voltage V0 is smaller than the absolute value (amplitude) of a pulse voltage (positive or negative pulse) applied to the bit line B1 in the recording mode or the resetting mode.

Then, the reproducing voltage V0 applied to the plate line P1*b* is applied to the variable resistance portion 1008*b*, so that an output voltage Vought according to the ratio between the resistance value R of the variable resistance portion 1008*b* and the resistance value R of the variable resistance portion 1008*a* is output to the bit line B1. Suppose the resistance value R of the variable resistance portion 1008*b* is "Rb" and the resistance value R of the variable resistance portion 1008*a* is "Ra", the output voltage Vought output to the bit line B1 is expressed as Vout=Ra/(Ra+Rb)×V0.

If pulse application in the recording mode is performed ten times and then pulse application in the resetting mode is performed ten times, the resistance values R of the variable resistance portions 1008*a* and 1008*b* change in the manner as shown in FIG. 11(*a*). FIG. 11(*b*) shows a result of measurement on an output voltage Vought output to the bit line B1 when a reproducing mode is performed at every application of a pulse voltage. As shown in FIG. 11(*b*), the output voltage Vought output to the bit line B1 varies depending on the resistance values R of the variable resistance portions 1008a and 1008b.

In this way, in the memory array circuit of this embodiment, different recording states are reproduced with high resolving power, and not only one-bit information but also multi-bit information is recorded/reproduced. For example, if the output voltage Vought when the resistance value R of the variable resistance portion (1008a, 1008b) is (100 Ω, 9 kΩ) corresponds to "0"and the output voltage Vought when the resistance value R of the variable resistance portion (1008a, 1008b) is (9 kΩ, 100 Ω) corresponds to "1", one-bit information is read out. If a plurality of states of the resistance value of the variable resistance portion (1008a, 1008b) between (100 Ω, 9 kΩ) and (9 kΩ, 100 Ω) determined in accordance with the number of pulses are brought into correspondence with a plurality of bits, multi-bit information is recorded/reproduced.

Case where resistance change of variable resistance portion is small

Now, a case where changes in the resistance values of the variable resistance portions 1008a and 1008b are small will be described with reference to FIGS. 12(a) and 12(b).

In general, characteristics of memory devices differ among memory arrays and among memory devices provided in the same memory array. Because of this difference, the resistance values of the respective memory devices might not change uniformly, i.e., there might be a case where the upper limit of the resistance value of a memory device is higher than a desired resistance value and the lower limit of the resistance value of another memory device is lower than a desired resistance value. In this way, the resistance changes in the variable resistance portions 1008a and 1008b constituting a memory cell MC100 might be small because of factors such as the location of the memory cell MC100. In such a case, if information is stored by utilizing a resistance change in a variable resistance portion, the small resistance change makes the resolving power low, so that the written information might not be read out. On the other hand, in the memory cell MC100 of this embodiment, the changes in the resistance values of the respective variable resistance portions 1008a and 1008b are complementary, and a voltage according to the ratio of these resistance values is output as an output voltage Vought. Accordingly, as shown in FIG. 12(a), even if the resistance values R of the variable resistance portions 1008a and 1008b are respectively halves of those shown in FIG. 11(a), for example, the output voltage Vought is substantially the same as that shown in FIG. 11(b), as shown in FIG. 12(b). In this manner, even if the resistance change differs among locations, different recording states are reproduced with high resolving power. Utilization of this characteristic allows further reduction of the voltage of an electrical pulse applied in writing.

Effects

As described above, in the memory array circuit of this embodiment, the time required for writing is extremely short, i.e., 10 neck. and the voltage necessary for writing is as low as 4 V, thus achieving reductions of write voltage and write speed and longer life, which are not achieved by conventional techniques.

In addition, the two variable resistors 5 (1008a) and 6 (1008b) are connected in series and have their resistance values change in a complementary manner. Accordingly, stable operation as a memory device is achieved and the mass-production yield is greatly increased.

The variable resistance film 1008 itself serving as a memory region is used in the form of an as-deposited film and does not need fine patterning, and therefore the film is suitable for mass-production, as compared to conventional memory devices.

In addition, the electrodes 1009a and 1009b need only be formed on a portion within the width of the conductive film 1007. Accordingly, if the conductive film 1007 is formed on a large area, the area where the electrodes 1009a and 100b can be formed is also enlarged. As a result, electrodes are formed with ease.

Furthermore, the resistance change is utilized as a technique of writing information, so that miniaturization for high density advantageously causes no serious problems.

MODIFIED EXAMPLE

In the foregoing example, in resetting, a voltage which has the same absolute value as that in recording but is of opposite polarity is applied. Alternatively, a voltage higher than that may be applied in resetting. Then, the number of resetting pulses is reduced.

As the variable resistance film 1008, an oxide with a $Pr_{0.7}Ca_{0.3}MnO_3$(PCMO) parasite structure is used. However, another giant magneto resistance material, a high temperature superconducting material (e.g., $Pr_{1-x}Ca_xMnO_3$(PCMO), $LaSrMnO_3$, $GdBaCo_xO_y$) or a nonlinear optical material with an limonite structure (e.g., $LiNbO_3$) may be used. In such a case, the same effects are obtained.

The variable resistance film 1008 using a PCMO material with a parasite structure is formed by sputtering. Alternatively, other methods for depositing thin films (e.g., CVD, MOCVD, spin coating and laser ablation) may be used.

In addition, Pt is used as a material of the conductive film 107. However, the material is not limited to this and a material composed of one of Ag, Au, Ir, Ru, Ti, Ta, Al, Cu, $RuO_3$, $RuO_2$, $SrRuO_3$, $LaCoO_3$, $SrCoO_3$, $LaSrCoO_3$, TiN, $TiO_x$, $YBa_2Cu_3O_x$, $IrO_2$, TaSiN and MoN or a material composed of two or more of the above elements may be used.

Further, Ag is used as a material of the electrodes 1009a and 1009b. However, the material is not limited to this and a material composed of one of Cu, Al, Ag, Pt, Au, Ir, Ru, Os, Ti and Ta or a material composed of two or more of the above elements may be used.

EMBODIMENT 4

Figure 13:
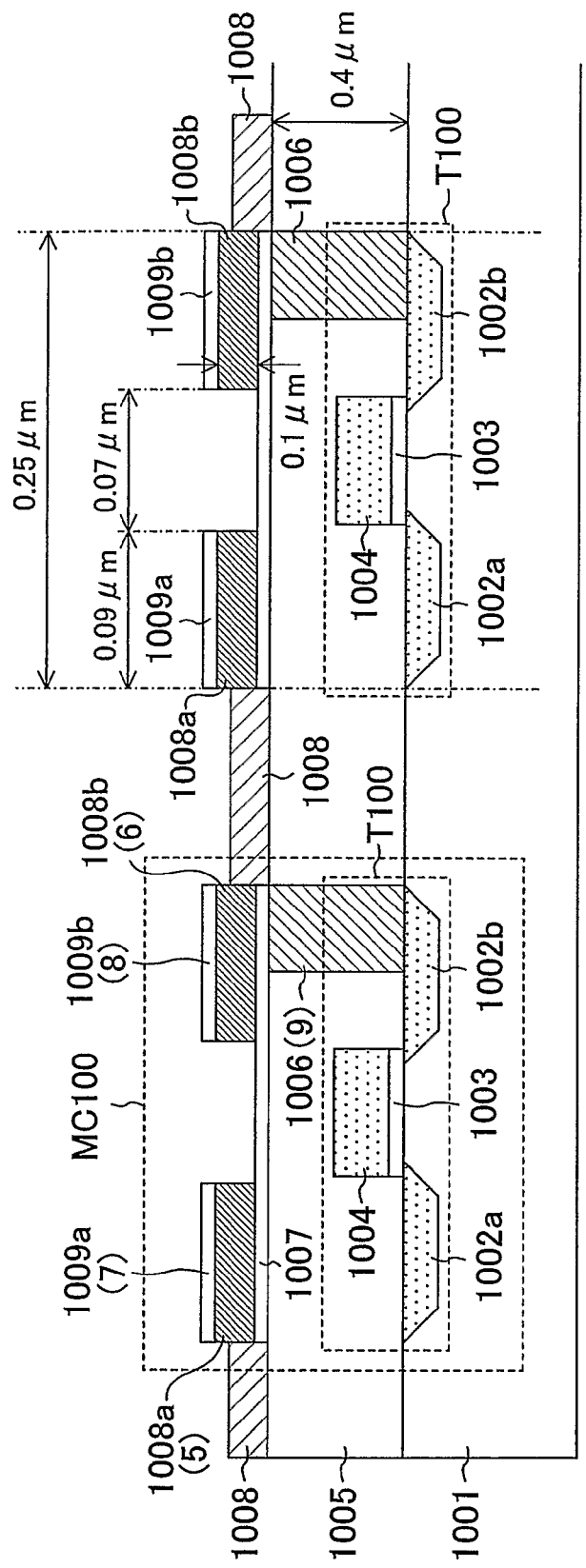
FIG. 13 shows a cross-sectional structure of a memory array circuit according to a fourth embodiment.

FIG. 13 shows a cross-sectional structure of a memory array circuit according to a fourth embodiment. In this memory array circuit, a portion of the variable resistance film 1008 shown in FIG. 9 located between the variable resistance portions 1008a and 1008b is omitted. The other part of the structure is the same as that shown in FIG. 9.

In the memory array circuit shown in FIG. 13, each memory cell MC100 has a width of 0.25 μm, a variable resistance film 1008 has a thickness of 0.1 μm, a protective insulating film 1005 has a thickness of is 0.4 μm, and electrodes 1009a and 1009b each have a width of 0.09 μm. The conductive film 1007 has a width of 0.25 μm, which is equal to that of the memory cell MC100, and the distance between the electrodes 1009a and 1009b is 0.07 μm.

In this memory array circuit, the variable resistance film 1008 is not present between the variable resistance portions 1008a and 1008b, so that an electric field generated between the electrode 1009a and the conductive film 1007 does not affect the electrode 1009b. Accordingly, as compared to the third embodiment, the distance between the electrodes 1009a and 1009b is short, so that the size of the memory cell MC100 is reduced.

EMBODIMENT 5

Circuit Configuration of Memory Array Circuit

Figure 14:
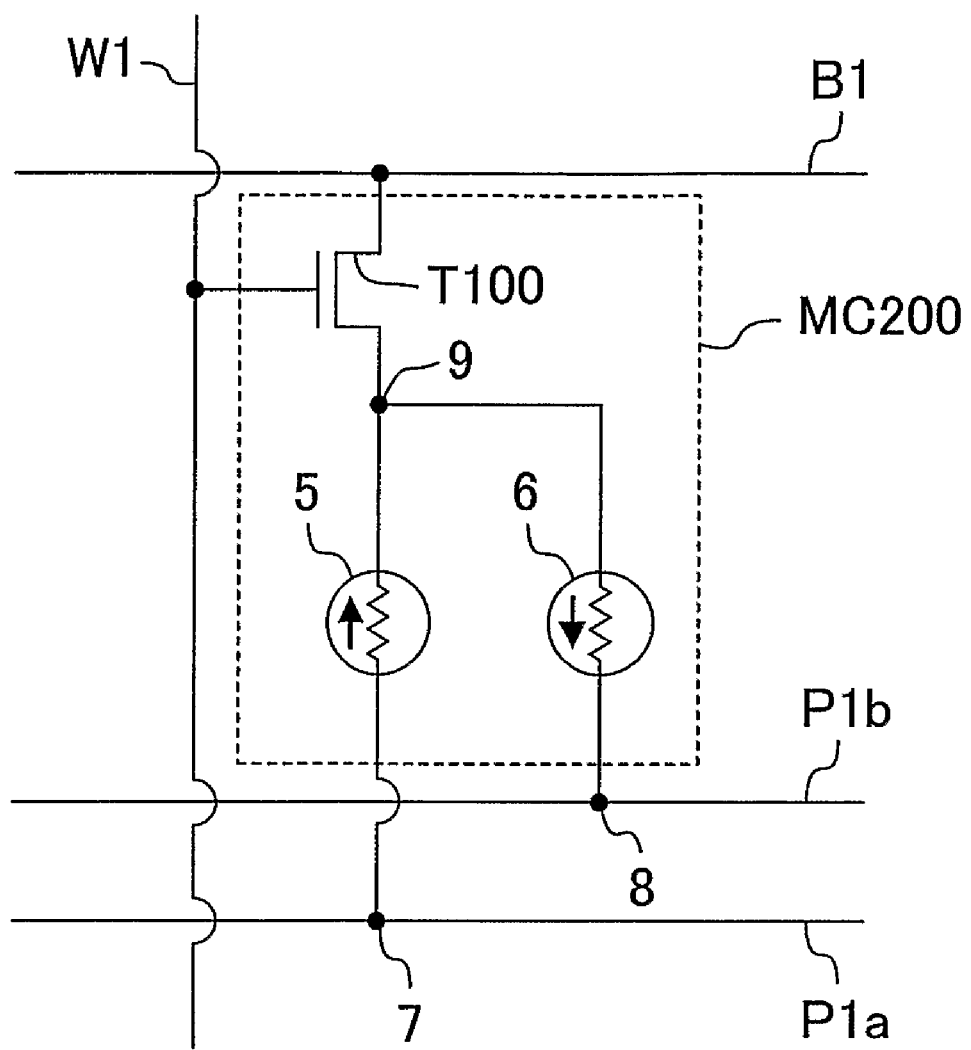
FIG. 14 is a circuit diagram showing a configuration of a memory cell according to a fifth embodiment.

A memory array circuit according to a fifth embodiment includes a memory cell MC200 shown in FIG. 14 instead of the memory cell MC100 shown in FIG. 8. The other part of the configuration is the same as that of the memory array circuit shown in FIG. 8.

The memory cell MC200 includes variable resistors 5 and 6 and a transistor T100. The variable resistor 6 of the memory cell MC200 has its initial resistance value set at 9 kΩ through the initialization process described with reference to FIGS. 2 and 3. The resistance value of the variable resistor 6 increases when a pulse voltage for setting a power supply terminal 8 to positive is applied between the power supply terminal 8 and an input/output terminal 9 and the resistance value thereof decreases when a pulse voltage for setting the power supply terminal 8 to negative is applied. The other part of the memory cell MC200 is the same as that of the memory cell MC100 shown in FIG. 8.

Cross-sectional Structure of Memory Array Circuit

The cross-sectional structure of the memory array circuit shown in FIG. 14 is the same as that shown in FIG. 13. A variable resistance portion 1008a (variable resistor 5) has its initial resistance value set at 100 Ω through the initialization process described with reference to FIGS. 2 and 3. The resistance value of the variable resistance portion 1008a increases when a pulse voltage for setting a conductive film 1007 to positive is applied between the conductive film 1007 and an electrode 1009a and the resistance value thereof decreases when a pulse voltage for setting the conductive film 1007 to negative is applied. A variable resistance portion 1008b (variable resistor 6) has its initial resistance value set at 9 kΩ through the initialization process described with reference to FIGS. 2 and 3. The resistance value of the variable resistance portion 1008b increases when a pulse voltage for setting a conductive film 1007 to negative is applied between the conductive film 1007 and an electrode 1009b and the resistance value thereof decreases when a pulse voltage for setting the conductive film 1007 to positive is applied.

Operation of Memory Array Circuit

The memory array circuit has a recording mode, a resetting mode and a reproducing mode and records binary or multivalve information (bit data) in the memory cell MC200. Hereinafter, this will be described specifically.

Recording Mode

A recording mode in which information (bit data) is recorded in the memory cell MC200 shown in FIG. 14 (and FIG. 13) will be described with reference to FIGS. 15(a) and 15(b).

First, a ground voltage GND is applied to two plate lines (P1a and P1b in this case) associated with a memory cell MC200 in which information is to be recorded.

Next, a given voltage is applied to a word line (WI in this case) associated with the memory cell MC200 in which information is to be recorded, thereby bringing the transistor T100 into conduction.

Then, a positive pulse voltage (voltage: +4V and pulse width: 10 ns) is applied to a bit line (B1 in this case) associated with the memory cell MC200 in which information is to be recorded.

The pulse voltage applied to the bit line B1 is applied to the variable resistance portions 1008a and 1008b via the transistor T100. The resistance value R of the variable resistance portion 1008a increases from 100 Ω to 9 kΩ in accordance with the applied pulse voltage, and the resistance value R of the variable resistance portion 1008b decreases from 9 kΩ to 100 Ω in accordance with the applied pulse voltage (from first through tenth pulses shown in FIG. 15(b)).

In this manner, the resistance values R of the variable resistance portions 1008a and 1008b increases/decreases stepwise in accordance with the number of applications of pulse voltages (the number of pulses) applied to the bit line B1, thereby writing information in the memory cell MC200. That is, the storage state is set in accordance with the resistance values R of the variable resistance portions 1008a and 1008b.

Resetting Mode

A resetting mode in which information written in the memory cell MC200 shown in FIG. 14 (and FIG. 13) is erased will be described with reference to FIGS. 15(a) and 15(b). It is assumed that the resistance value R of the variable resistance portion 1008a is 9 kΩ and the resistance value R of the variable resistance portion 1008b is 100 Ω through the above recording mode (i.e., at the tenth pulse shown in FIG. 15(b)).

First, a ground voltage GND is applied to two plate lines (P1a and P1b in this case) associated with a memory cell MC200 from which information is to be erased.

Next, a given voltage is applied to a word line (W1 in this case) associated with the memory cell MC200 from which information is to be erased, thereby bringing the transistor T100 into conduction.

Then, a negative pulse voltage (voltage: −4V and pulse width: 10 ns) is applied to a bit line (B1 in this case) associated with the memory cell MC200 from which information is to be erased.

The pulse voltage applied to the bit line B1 is applied to the variable resistance portions 1008a and 1008b via the transistor T100. The resistance value R of the variable resistance portion 1008a decreases from 9 kΩ to 100 Ω in accordance with the applied pulse voltage, and the resistance value R of the variable resistance portion 1008b increases from 100 Ω to 9 kΩ in accordance with the applied pulse voltage (from eleventh through twelfth pulses shown in FIG. 15(b)).

In this manner, if a pulse voltage of polarity opposite to that of a pulse voltage applied in the recording mode is applied to each of the variable resistance portions 1008a and 1008b the same number of times as in the recording mode, information written in a memory cell MC200 is reset. That is, the storage states of the respective variable resistance portions 1008a and 1008b are reset to their initial states.

If the foregoing recording mode and resetting mode are alternately repeated for 10 pulses at each time, the resistance values R of the variable resistance portions 1008a and 1008b change regularly as shown in FIG. 15(b).

Reproducing Mode

The flow of a process through which information (bit data) written in the memory cell MC200 shown in FIG. 14 (and FIG. 13) is the same as that in the third embodiment.

MODIFIED EXAMPLE

In the memory array circuit shown in FIG. 14 (and FIG. 13), pulse voltages may be applied during recording and resetting in the following manner.

In recording information in the memory cell MC200, a recording pulse voltage (voltage: +2V and pulse width: 10 ns) is applied to the bit line B1, and a pulse voltage (voltage: −2V and pulse width: 10 ns) of polarity opposite to that of the recording pulse is applied to the plate lines P1a and P1b in synchronization with the recording pulse. Then, a pulse voltage (+4V) for setting the conductive film 1007 to positive is applied between the conductive film 1007 and the electrode 1009a, and the resistance value of the variable resistance portion 1008a increases. In addition, a pulse voltage (−4V) for setting the electrode 1009b to negative is applied between the conductive film 1007 and the electrode 1009b, and the resistance value of the variable resistance portion 1008b decreases. As a result, the resistance changes in a similar manner to that shown in FIG. 15(b).

In resetting, a negative resetting pulse voltage (voltage: −2V and pulse width: 10 ns) of polarity opposite to that in recording is applied to the bit line B1, and a pulse voltage (voltage: +2V and pulse width: 10 ns) of polarity opposite to that of the resetting pulse is applied to the plate lines P1a and P1b in synchronization with the resetting pulse. Then, a pulse voltage (−4V) for setting the conductive film 1007 to negative is applied between the conductive film 1007 and the electrode 1009a, and the resistance value of the variable resistance portion 1008a decreases. In addition, a pulse voltage (+4V) for setting the electrode 1009b to positive is applied between the conductive film 1007 and the electrode 1009b, and the resistance value of the variable resistance portion 1008b increases. As a result, the resistance changes in a similar manner to that shown in FIG. 15(b).

EMBODIMENT 6

Background

Figure 16:
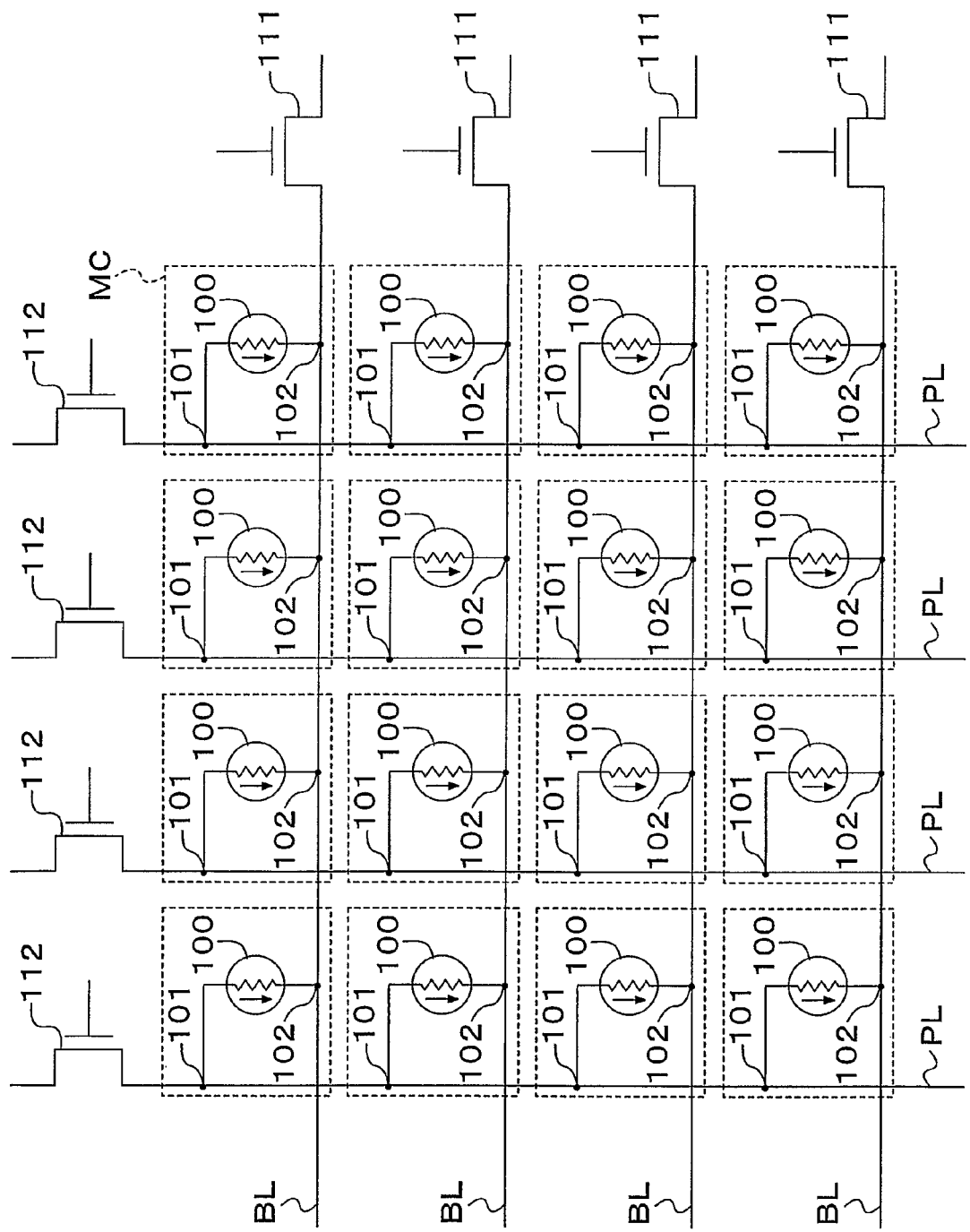
FIG. 16 shows an example of a memory LSI with a cross-point structure.

As a large-capacity memory LSI using the variable resistor described with reference to FIGS. 1 through 3, a memory LSI with a cross-point structure as shown in FIG. 16 is proposed. The memory LSI shown in FIG. 16 includes: a plurality of bit lines BL; and a plurality of plate lines PL orthogonal to the bit lines BL. A bit-line-selecting transistor 111 is provided on each of the bit lines BL and a plate-line-selecting transistor 112 is provided on each of the plate lines PL. Memory cells MC are provided at the respective intersections of the bit lines BL and the plate lines PL. In each of the memory cells MC, two electrodes 101 and 102 are connected to a variable resistor 100. In the memory cell MC, when an electrical pulse for setting the electrode 102 to positive with respect to the electrode 101 is applied between the electrodes 101 and 102, the resistance value of the variable resistor 100 increases. On the other hand, if an electrical pulse for setting the electrode 102 to negative with respect to the electrode 101 is applied between the electrodes 101 and 102 in a state in which the variable resistor 100 has a large resistance value, the resistance value of the variable resistor 100 decreases.

However, in the memory LSI with the cross-point structure shown in FIG. 16, electrical pulses applied during recording affect memory cells other than the memory cell at the intersection of a selected bit line BL and a selected plate line PL and, during reproduction, a reproducing signal is affected by the resistance values of the variable resistors in the memory cells other than the selected memory cell, thus causing an S/N deterioration. This will increase errors in recording/reproduction as the size of semiconductors is reduced.

Overall Configuration of Memory LSI

Figure 17:
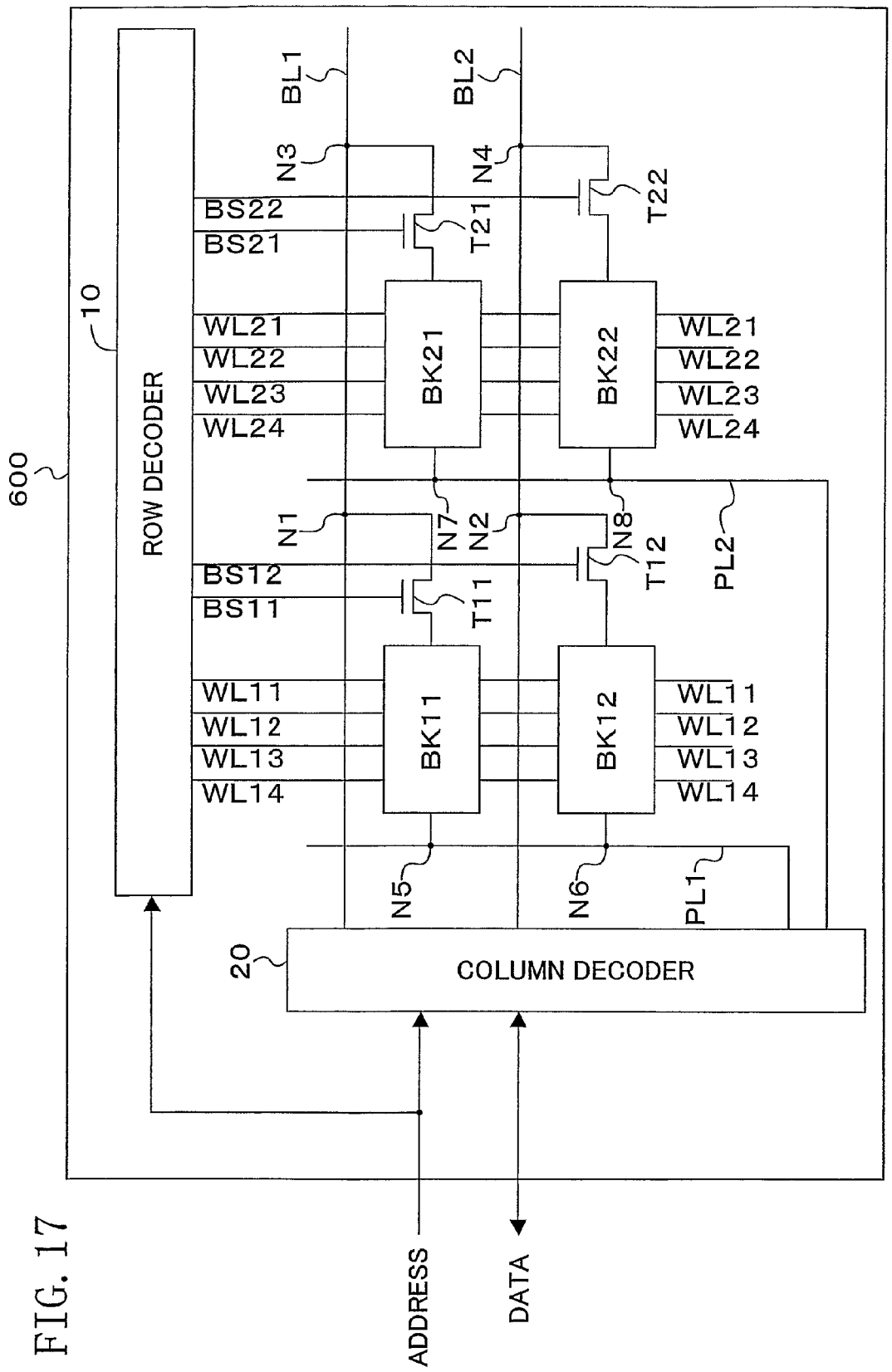
FIG. 17 is an exemplary block diagram showing an overall configuration of a memory LSI according to a sixth embodiment.

An overall configuration of a memory LSI according to a sixth embodiment of the present invention is shown in FIG. 17. This memory LSI 600 includes: memory blocks BK11, BK12, BK21 and BK22; a row decoder 10; a column decoder 20; transistors T11, T12, T21 and T22; word lines WL11 through WL14 and WL21 through WL24; bit lines BL1 and BL2; block-selecting-signal lines BS11, BS12, BS21 and BS22; and plate lines PL1 and PL2.

The memory blocks BK11, BK12, BK21 and BK22 are arranged in rows and columns, i.e., in a matrix pattern.

The word lines WL11 through WL14 and WL21 through WL24 are arranged in columns. The word lines WL11 through WL14 are associated with the memory blocks BK11 and BK12. The word lines WL21 through WL24 are associated with the memory blocks BK21 and BK22.

The bit lines BL1 and BL2 are arranged in rows. The bit line BL1 is associated with the memory blocks BK11 and BK21. The bit line BL2 is associated with the memory blocks BK12 and BK22.

The plate line PL1 is associated with the memory blocks BK11 and BK12. The plate line PL2 is associated with the memory blocks BK21 and BK22.

The transistor T11 and the memory block BK11 are connected in series between a node N1 on the bit line BL1 and a node N5 on the plate line PL1. The gate of the transistor T11 is connected to the block-selecting-signal line BS11. The transistor T12 and the memory block BK12 are connected in series between a node N2 on the bit line BL2 and a node N6 on the plate line PL1. The gate of the transistor T12 is connected to the block-selecting-signal line BS12. The transistor T21 and the memory block BK21 are connected in series between a node N3 on the bit line BL1 and a node N7 on the plate line PL2. The gate of the transistor T21 is connected to the block-selecting-signal line BS21. The transistor T22 and the memory block BK22 are connected in series between a node N4 on the bit line BL2 and a node N8 on the plate line PL2. The gate of the transistor T22 is connected to the block-selecting-signal line BS22.

The row decoder 10 receives an address signal from the outside and activates associated ones of the block-selecting-signal lines and the word lines.

In writing, the column decoder 20 receives an address signal from the outside and adds an electrical pulse according to data to be written between respective ones of the bit lines and the plate lines associated with the address signal. On the other hand, in reading, the column decoder 20 applies a given voltage between respective ones of the bit lines and the plate lines associated with an address signal from the outside, detects the value of a current caused to flow by this application, and outputs data according to the detected current value to the outside.

Internal Configuration of Memory Block BK11

Figure 18:
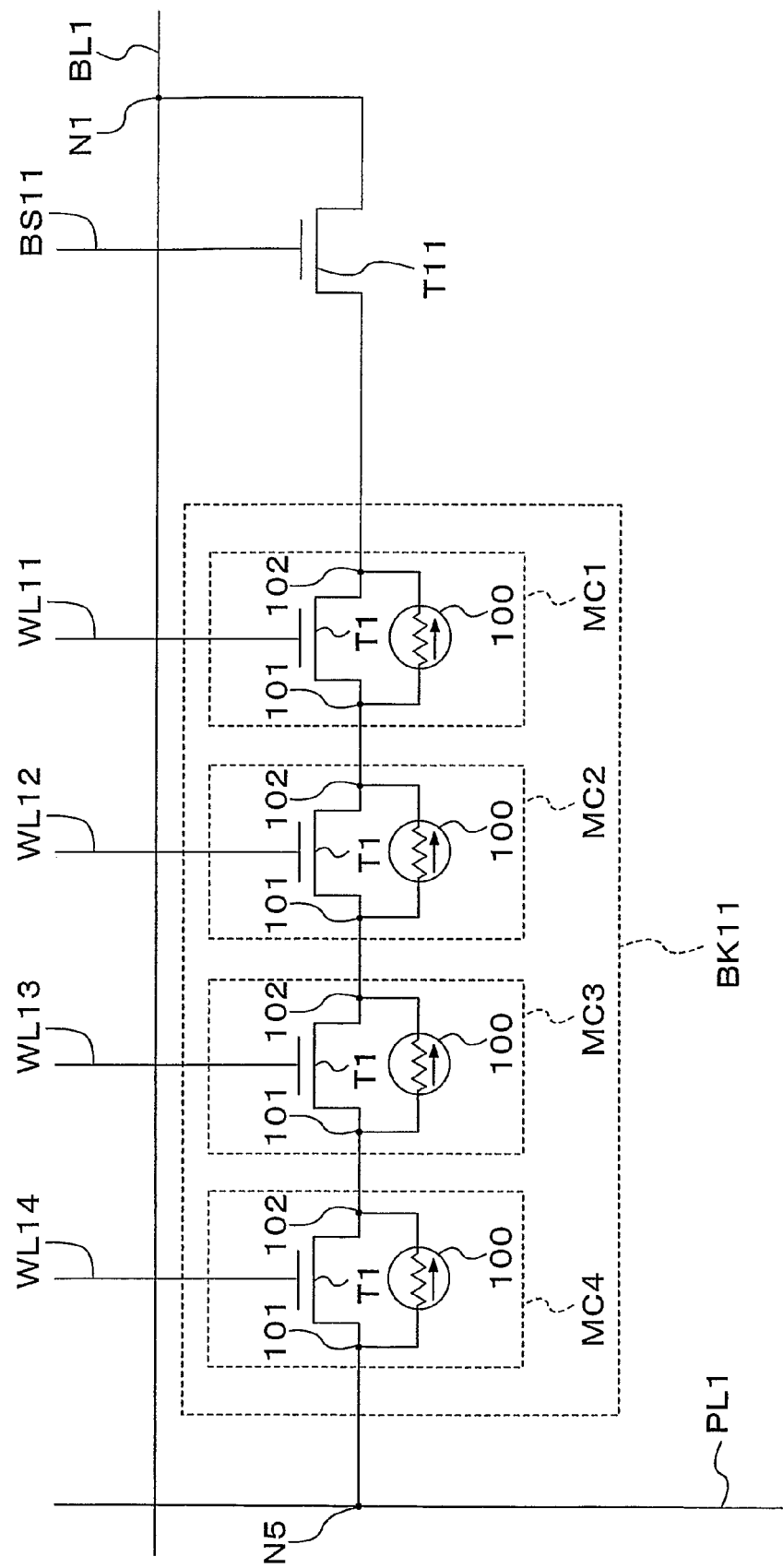
FIG. 18 shows an internal configuration of the memory block shown in FIG. 17.

FIG. 18 shows an internal configuration of the memory block BK11 shown in FIG. 17. The memory block BK11 includes memory cells MC1 through MC4. The memory cells MC1 through MC4 are connected in series between the transistor T11 and the node N5 on the plate line PL1. The memory cells MC1 through MC4 are associated with the word lines WL11 through WL14, respectively. Each of the memory cells MC1 through MC4 includes a variable resistor 100, electrodes 101 and 102 and a transistor T1. The variable resistor 100 is connected between the electrodes 101 and 102. The variable resistor 100 is made of a material whose resistance value changes (increases/decreases) in response to an electrical pulse applied between the electrodes 101 and 102. The transistor T1 is connected in parallel with the variable resistor 100 between the electrodes 101 and 102. The gate of the transistor T1 is connected to the associated one of the word lines.

The internal configurations of the memory blocks BK12, BK21, BK22 are the same as that of the memory block BK11 shown in FIG. 18.

Characteristics of Variable Resistor 100

Now, characteristics of the variable resistor 100 included in each of the memory cells MC1 through MC4 will be described.

As shown in FIG. 19(a), in a state where the resistance value R of the variable resistor 100 is a small resistance value r1, if an electrical pulse (e.g., pulse width: 100 ns and amplitude V0=4V) for setting the electrode 102 to positive with respect to the electrode 101 is applied between the electrodes 101 and 102, the resistance value R of the variable resistor 100 increases from r1 to r2. In a state where the resistance value R of the variable resistor 100 is the large resistance value r2, if an electrical pulse for setting the electrode 102 to positive with respect to the electrode 101 is applied between the electrodes 101 and 102, the state of the large resistance value r2 is maintained.

On the other hand, as shown in FIG. 19(b), in a state where the resistance value R of the variable resistor 100 is the large resistance value r2, if an electrical pulse (e.g., pulse width: 100 ns and amplitude (−V0)=−4V) for setting the electrode 102 to negative with respect to the electrode 101 is applied between the electrodes 101 and 102, the resistance value R of the variable resistor 100 decreases from r2 to r1. In a state where the resistance value R of the variable resistor 100 is the small resistance value r1, if an electrical pulse for setting the electrode 102 to negative with respect to the electrode 101 is applied between the electrodes 101 and 102, the state of the small resistance value r1 is maintained.

Figure 19:
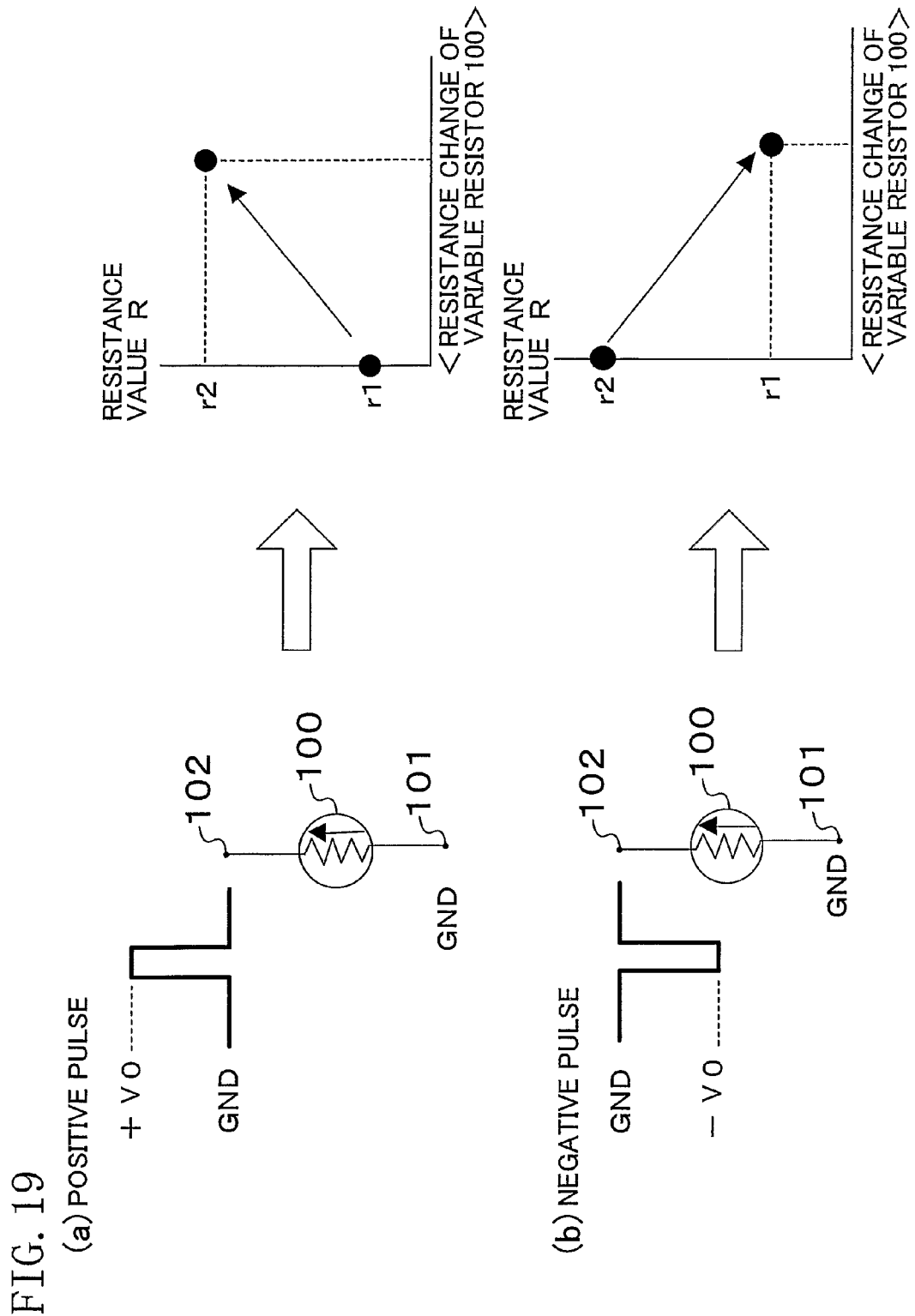
FIG. 19 shows a characteristic of a variable resistor included in each memory cell.

In FIG. 19, the circuit symbol representing the variable resistor 100 exhibits that an application of an electrical pulse for setting the tip of the arrow to positive (i.e., setting the electrode 102 to positive with respect to the electrode 101) between the electrodes 101 and 102 causes the resistance value R of the variable resistor 100 to increase whereas an application of an electrical pulse for setting the tip of the arrow to negative (i.e., setting the electrode 102 to negative with respect to the electrode 101) between the electrodes 101 and 102 causes the resistance value R of the variable resistor 100 to decrease.

The resistance value R of the variable resistor 100 which is currently held is kept until the next electrical pulse is applied. Accordingly, if one of the small resistance value r1 and the large resistance value r2 corresponds to "0" and the other corresponds to "1", the device of this embodiment operates as a nonvolatile memory device capable of storing digital information.

Writing of Information Into Memory Cell

Now, write operation of the memory LSI 600 shown in FIG. 17 will be described. Hereinafter, a case where data is written in the memory cell MC1 in the memory block BK11 will be described as an example.

An address indicating the memory cell MC1 in the memory block BK11 and data to be written in the memory cell MC1 are supplied from the outside.

In response to the supplied address, the row decoder 10 activates the block-selecting-signal line BS11 and deactivates the block-selecting-signal lines BS12, BS21 and BS22. The row decoder 10 deactivates the word line WL11 and activates the word lines WL12 through WL14 and WL21 through WL24. Accordingly, the transistor T11 is turned ON and the transistors T12, T21 and T22 are turned OFF. The transistor T1 in the memory cell MC1 in the memory block BK11 is turned OFF and the transistors T1 in the memory cells MC2 through MC4 in the memory block BK11 are turned ON. The resistance value between the electrodes 101 and 102 in each of the memory cells MC2 through MC4 in which the transistors T1 are ON is small because this resistance value is dominated by the internal resistance of the transistor T1 which is lower than that of the variable resistor 100 connected in parallel therewith. On the other hand, the resistance value between the electrodes 101 and 102 in the memory cell MC1 in which the transistor T1 is OFF is large because this resistance value is dominated by the resistance value of the variable resistor 100.

In this state, the column decoder 20 applies an electrical pulse between the bit line BL1 and the plate line PL1 in response to the supplied address. The column decoder 20 applies an electrical pulse whose polarity is determined by data to be written. For example, with respect to the resistance value R of the variable resistor 100, if the small resistance value r1 corresponds to "0" and the large resistance value r2 corresponds to "1", an electrical pulse of the following polarity is applied.

In the case of writing data "1" in the memory cell MC1 in the memory block BK11, an electrical pulse (e.g., pulse width: 100 ns and amplitude V0=4V) for setting the bit line BL1 to positive with respect to the plate line PL1 is applied between the bit line BL1 and the plate line PL1. Accordingly, as shown in FIG. 19(a), an electrical pulse for setting the electrode 102 to positive with respect to the electrode 101 is applied to the variable resistor 100 in the memory cell MC1 in the memory block BK11. As a result, the resistance value R of the variable resistor 100 becomes r2, which means data "1" is written in the memory cell MC1 in the memory block BK11. In each of the memory cells MC2 through MC4 in the memory block BK11, the transistor T1 is ON, so that an electrical pulse enough to change the resistance value of the variable resistor 100 is not applied to the variable resistor 100.

On the other hand, in the case of writing data "0" in the memory cell MC1 in the memory block BK11, an electrical pulse (e.g., pulse width: 100 ns and amplitude (−V0)=−4V) for setting the bit line BL1 to negative with respect to the plate line PL1 is applied between the bit line BL1 and the plate line PL1. Accordingly, as shown in FIG. 19(b), an electrical pulse for setting the electrode 102 to negative with respect to the electrode 101 is applied to the variable resistor 100 in the memory cell MC1 in the memory block BK11. As a result, the resistance value R of the variable resistor 100 becomes r1, which means data "0" is written in the memory cell MC1 in the memory block BK11. In each of the memory cells MC2 through MC4 in the memory block BK11, the transistor T1 is ON, so that an electrical pulse enough to change the resistance value of the variable resistor 100 is not applied to the variable resistor 100.

Readout of Information From Memory Cell

Now, read operation of the memory LSI 600 shown in FIG. 17 will be described. Hereinafter, the case of reading data from the memory cell MC1 in the memory block BK11 is used as an example.

An address indicating the memory cell MC1 in the memory block BK11 is supplied from the outside.

In response to the supplied address, the row decoder 10 activates the block-selecting-signal line BS11 and deactivates the block-selecting-signal lines BS12, BS21 and BS22. The row decoder 10 deactivates the word line WL11 and activates the word lines WL12 through WL14 and WL21 through WL24. Accordingly, the transistor T11 is turned ON and the transistors T12, T21 and T22 are turned OFF. The transistor T1 in the memory cell MC1 in the memory block BK11 is turned OFF and the transistors T1 in the memory cells MC2 through MC4 in the memory block BK11 are turned ON.

In this state, in response to the supplied address, the column decoder 20 applies a given voltage V1 (e.g., V1=1V) between the bit line BL1 and the plate line PL1. Accordingly, current flows through the path: (the bit line BL1)—(the transistor T11)—(the variable resistor 100 in the memory cell MC1 in the memory block BK11)—(the transistor T1 in the memory cell MC2 in the memory block BK11)—(the transistor T1 in the memory cell MC3 in the memory block BK11)—(the transistor T1 in the memory cell MC4 in the memory block BK11)—(the plate line PL1). The ON-resistances of the transistor T11 and the transistors T1 in the memory cells MC2 through MC4 in the memory block BK11 are substantially the same, so that the value of the current flowing through the path varies depending on the resistance value R of the variable resistor 100 in the memory cell MC1 in the memory block BK11. For example, when the resistance value R of the variable resistor 100 in the memory cell MC1 in the memory block BK11 is the small resistance value r1, the current flowing through the path has a value I1 larger than a value I2 of the current flowing through the path when the resistance value R of the variable resistor 100 is the large resistance value r2.

The column decoder 20 detects the value of the current flowing through the path, compares the detected value with a given threshold value Th (e.g., I2<Th<I1) and, in accordance with the comparison result, outputs data "0" or "1" to the outside as read-out data. With respect to the resistance value R of the variable resistor 100, in a case where the small resistance value r1 corresponds to "0" and the large resistance value r2 corresponds to "1", if the detected current value is greater than the threshold value Th, data "0" is output to the outside as read-out data whereas if the detected current value is smaller than the threshold value Th, data "1" is output to the outside as read-out data.

Effects

As described above, in the memory LSI 600 of the sixth embodiment, the transistors T11, T12, T21 and T22 are provided for the respective memory blocks BK11, BK12, BK21 and BK22, and one of the transistors associated with a memory block including a memory cell to be accessed is turned ON and the other transistors are turned OFF. In addition, the transistor T1 in the memory cell to be accessed is turned OFF and the transistors T1 in the other memory cells are turned ON. Accordingly, the voltage applied between the bit line and plate line associated with the memory cell to be accessed has a smaller effect on the other memory cells (variable resistors 100) during writing, and a reproducing signal is less affected by the variable resistors in the memory cells other than the memory cell to be accessed during reproduction. As a result, even with advanced miniaturization of semiconductors, fewer errors occur in recording and reproduction than in a conventional memory device with a cross-point structure.

As compared to a case where one transistor for selecting a memory cell is provided to each memory cell, the memory cell size is reduced, thus achieving large capacity by increased density.

MODIFIED EXAMPLE

In this embodiment, the four memory blocks BK11, BK12, BK21 and BK22 are arranged in rows and columns, i.e., in a matrix pattern. However, the number of memory blocks is not limited to four. If a larger number of memory blocks are arranged in a matrix pattern to form a memory array, the resultant memory LSI achieves high-speed operation and/or large capacity as compared to a conventional memory such as a flash memory or a ferroelectric memory.

In this embodiment, the four memory cells (MC1 through MC4) are included in each of the memory blocks BK11, BK12, BK21 and BK22. However, of course, the number of memory cells is not limited to four.

Moreover, in this embodiment, the resistance value R of the variable resistor 100 in a memory cell is changed to the low-resistance state r1 or the high-resistance state r2 by an electrical pulse shown in FIG. 19, and one of the states corresponds to "0" and the other state corresponds to "1", thereby performing digital recording using one bit on each memory cell. However, if the pulse width and the pulse amplitude (pulse voltage) of the applied electrical pulse are adjusted, the resistance value R of the variable resistor 100 in the memory cell can be changed to a value intermediate between the maximum resistance value in the high resistance state and the minimum resistance value in the low resistance state. For example, if n-bit information is recorded/reproduced into/from a memory cell using $2^n$ (where n=2, 3, 4 . . . ) different resistance values, a memory device with larger capacity can be obtained.

EMBODIMENT 7

Overall Configuration of Memory LSI

Figure 20:
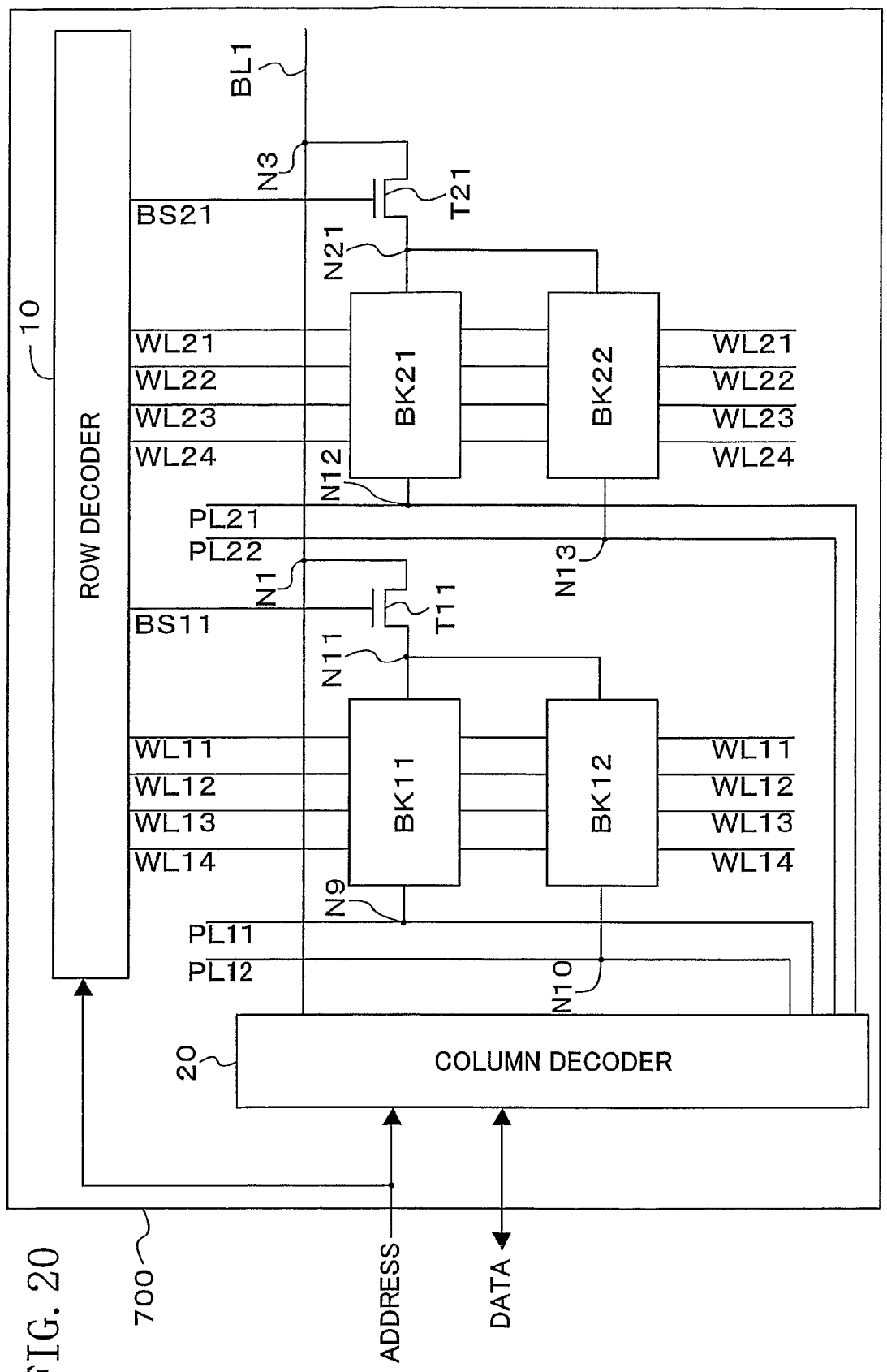
FIG. 20 is an exemplary block diagram showing an overall configuration of a memory LSI according to a seventh embodiment.

An overall configuration of a memory LSI according to a seventh embodiment of the present invention is shown in FIG. 20. This memory LSI 700 includes: memory blocks BK11, BK12, BK21 and BK22; a row decoder 10; a column decoder 20; transistors T11 and T21; word lines WL11 through WL14 and WL21 through WL24; a bit line BL1; block-selecting-signal lines BS11 and BS21; and plate lines PL11, PL12, PL21 and PL22.

The bit line BL1 is associated with the memory blocks BK11, BK12, BK21 and BK22.

The plate line PL11 is associated with the memory block BK11. The plate line PL12 is associated with the memory block BK12. The plate line PL21 is associated with the memory block BK21. The plate line PL22 is associated with the memory block BK22.

The transistor T11 and the memory block BK11 are connected in series between a node N1 on the bit line BL1 and a node N9 on the plate line PL11. The memory block BK12 is connected between an interconnect node N11 connecting the transistor T11 and the memory block BK11 and a node N10 on the plate line PL12. The transistor T21 and the memory block BK21 are connected in series between a node N3 on the bit line BL1 and a node N12 on the plate line PL21. The memory block BK22 is connected between an interconnect node N21 connecting the transistor T21 and the memory block BK21 and a node N13 on the plate line PL22.

Internal Configurations of Memory Blocks BK11 and BK12

Figure 21:
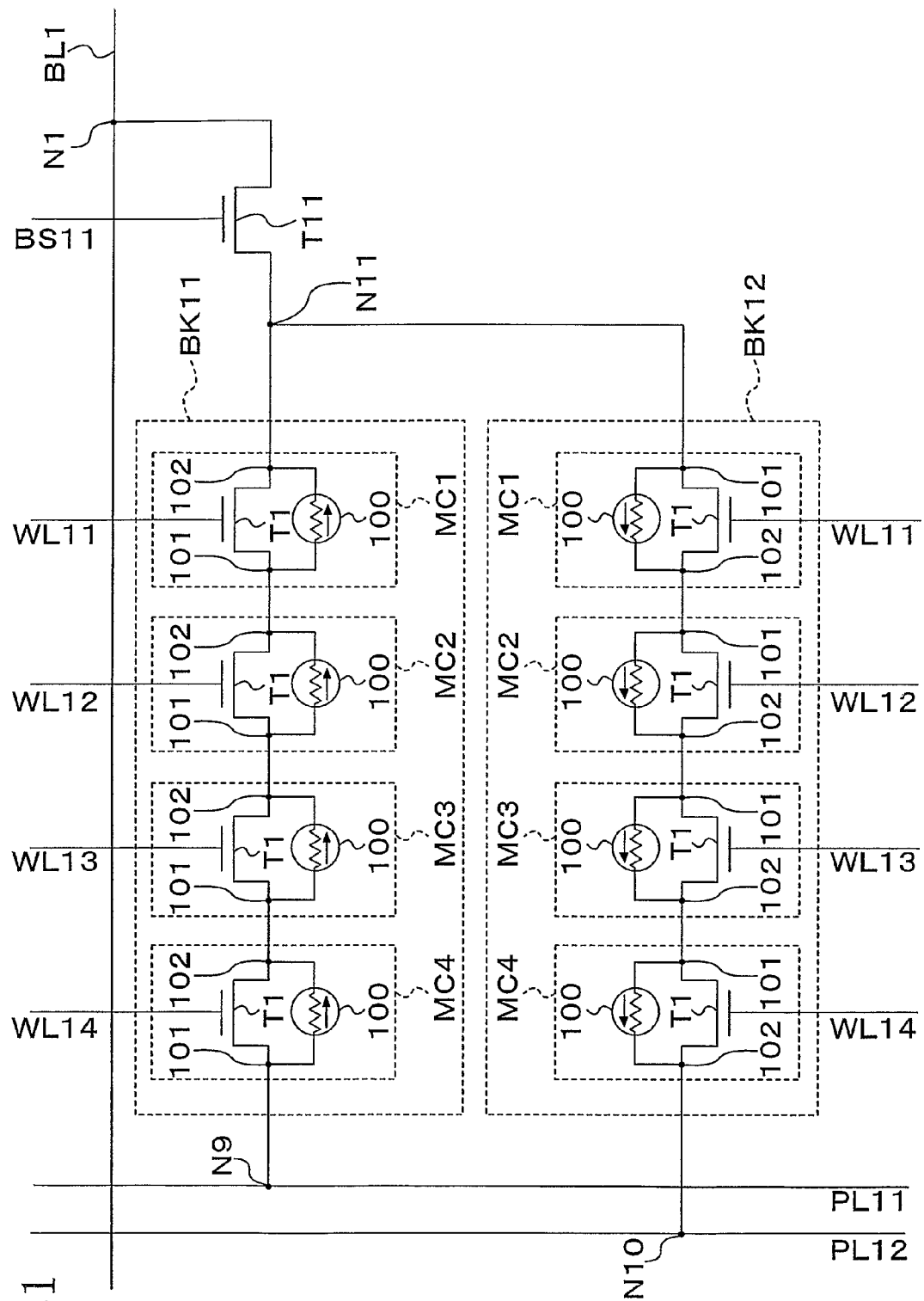
FIG. 21 is an internal configuration of the memory block shown in FIG. 20.

FIG. 21 shows internal configurations of the memory blocks BK11 and BK12 shown in FIG. 20. Each of the memory blocks BK11 and BK12 includes memory cells MC1 through MC4. The memory cells MC1 through MC4 in the memory block BK11 are connected in series between the node N11 and the node N9 on the plate line PL11. Each of the memory cells MC1 through MC4 in the memory block BK11 is configured such that an electrode 101 is provided toward the plate line PL11 and an electrode 102 is provided toward the node N11. The memory cells MC1 through MC4 in the memory block BK12 are connected in series between the node N11 and the node N10 on the plate line PL12. Each of the memory cells MC1 through MC4 in the memory block BK12 is configured such that an electrode 102 is provided toward the plate line PL12 and an electrode 101 is provided toward the node N11.

The internal configuration of the memory block BK21 is the same as that of the memory block BK11, and the internal configuration of the memory block BK22 is the same as that of the memory block BK12.

Writing of Information Into Memory Cell

Now, write operation of the memory LSI 700 shown in FIG. 20 will be described. In this LSI 700, out of the memory cells in the memory blocks BK11 and BK12, one-bit information is stored in a pair of memory cells associated with the same word line (e.g., the memory cell MC1 in the memory block BK11 and the memory cell MC1 in the memory block BK12, which are both associated with the word line WL11). In the same manner, out of the memory cells in the memory blocks BK21 and BK22, one-bit information is stored in a pair of memory cells associated with the same word line (e.g., the memory cell MC1 in the memory block BK21 and the memory cell MC1 in the memory block BK22, which are both associated with the word line WL21). Specifically, if a state in which a variable resistor 100 of one of the pair of memory cells has a low resistance r1 and a variable resistor 100 of the other has a high resistance r2 corresponds to "0" and a state in which the variable resistor 100 of the former memory cell has the high resistance r2 and the variable resistor of the latter memory cell has the low resistance r1 corresponds to "1", one-bit information is stored in the pair of memory cells. In this case, a state in which the variable resistors 100 in memory cells in the memory blocks BK11 and BK21 have the low resistance r1 and the variable resistors 100 in memory cells in the memory blocks BK12 and BK22 have the high resistance r2 corresponds to "0", a state in which the variable resistors 100 in memory cells in the memory blocks BK11 and BK21 have the high resistance r2 and the variable resistors 100 in memory cells in the memory blocks BK12 and BK22 have the low resistance r1 corresponds to "1", and information is written in the pair of memory cells consisting of the memory cell MC1 in the memory block BK11 and the memory cell MC1 in the memory block BK12.

An address indicating the pair of memory cells consisting of the memory cell MC1 in the memory block BK11 and the memory cell MC1 in the memory block BK12 and data to be written in the pair of memory cells are supplied from the outside.

In response to the supplied address, the row decoder 10 activates the block-selecting-signal line BS11 and deactivates the block-selecting-signal line BS21. The row decoder 10 deactivates the word line WL11 and activates the word lines WL12 through WL14 and WL21 through WL24. Accordingly, the transistor T11 is turned ON and the transistor T21 is turned OFF. In addition, the transistors T1 in the memory cells MC1 in the memory blocks BK11 and BK12 are turned OFF and the transistors T1 in the memory cells MC2 through MC4 in the memory blocks BK11 and BK12 are turned ON.

In this state, in response to the supplied address, the column decoder 20 applies an electrical pulse between the bit line BL1 and the plate lines PL11, PL12. The polarity of the electrical pulse applied by the column decoder 20 is determined by data to be written.

Figure 22:
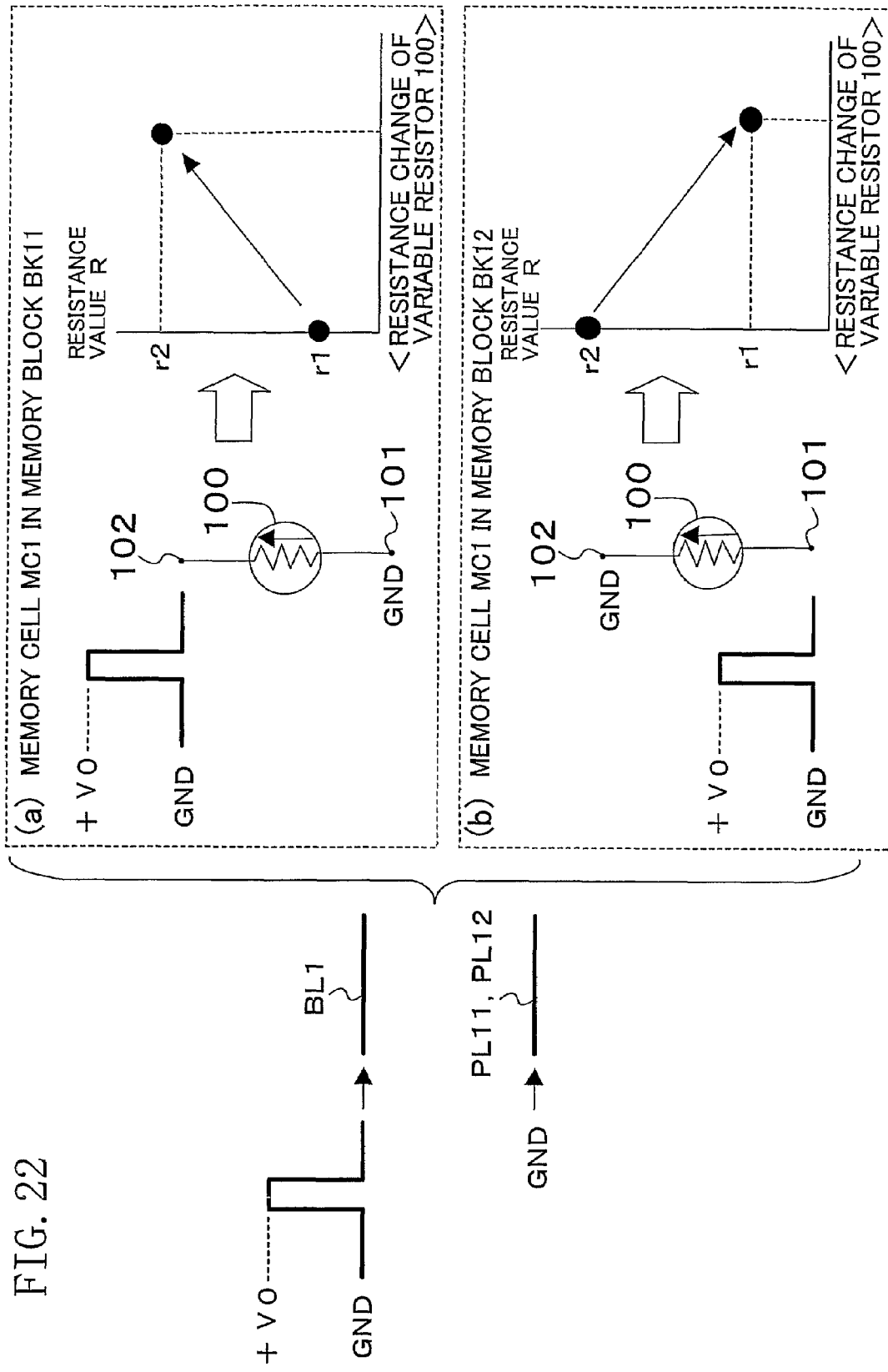
FIG. 22 is an exemplary diagram for explaining write operation of the memory LSI shown in FIG. 20.

In the case of writing data "1" in the pair of memory cells consisting of the memory cell MC1 in the memory block BK11 and the memory cell MC1 in the memory block BK12, an electrical pulse (e.g., pulse width: 100 ns and amplitude V0=4V) for setting the bit line BL1 to positive with respect to the plate lines PL11 and PL12 is applied between the bit line BL1 and the plate lines PL11, PL12, as shown in FIG. 22. Accordingly, as shown in FIG. 22(a), an electrical pulse for setting the electrode 102 to positive with respect to the electrode 101 is applied to the variable resistor 100 in the memory cell in the memory block BK11, and the resistance value R of the variable resistor 100 becomes r2. On the other hand, as shown in FIG. 22(b), an electrical pulse for setting the electrode 102 to negative with respect to the electrode 101 is applied to the variable resistor 100 in the memory cell MC1 in the memory block BK12, and the resistance value R of the variable resistor 100 becomes r1. As a result, the variable resistor 100 in the memory cell MC1 in the memory block BK11 has the high resistance r2 and the variable resistor 100 in the memory cell MC1 in the memory block BK12 has the low resistance r1, which means data "1" is written in the pair of memory cells consisting of the memory cell MC1 in the memory block BK11 and the memory cell MC1 in the memory block BK12.

On the other hand, in the case of writing data "0" in the pair of memory cells consisting of the memory cell MC1 in the memory block BK11 and the memory cell MC1 in the memory block BK12, an electrical pulse (e.g., pulse width: 100 ns and amplitude (−V0)=−4V) for setting the bit line BL1 to negative with respect to the plate lines PL11 and PL12 is applied between the bit line BL1 and the plate lines PL11, PL12. Accordingly, an electrical pulse for setting the electrode 102 to negative with respect to the electrode 101 is applied to the variable resistor 100 in the memory cell MC1 in the memory block BK11, and the resistance value R of the variable resistor 100 becomes r1. On the other hand, an electrical pulse for setting the electrode 102 to positive with respect to the electrode 101 is applied to the variable resistor 100 in the memory cell MC1 in the memory block BK12, and the resistance value R of the variable resistor 100 becomes r2. As a result, the variable resistor 100 in the memory cell MC1 in the memory block BK11 has the low resistance r1 and the variable resistor 100 in the memory cell MC1 in the memory block BK12 has the high resistance r2, which means data "0" is written in the pair of memory cells consisting of the memory cell MC1 in the memory block BK11 and the memory cell MC1 in the memory block BK12.

Readout of Information From Memory Cell

Now, read operation of the memory LSI 700 shown in FIG. 20 will be described. In the following example, a state in which the variable resistors 100 in the memory cells in the memory blocks BK11 and BK21 have the low resistance r1 and the variable resistors 100 in the memory cells in the memory blocks BK12 and BK22 have the high resistance r2 corresponds to "0", a state in which the variable resistors 100 in the memory cells in the memory blocks BK11 and BK21 have the high resistance r2 and the variable resistors 100 in the memory cells in the memory blocks BK12 and BK22 have the low resistance r1 corresponds to "1", and data is read out from the pair of memory cells consisting of the memory cell MC1 in the memory block BK11 and the memory cell MC1 in the memory block BK12.

An address indicating the pair of memory cells consisting of the memory cell MC1 in the memory block BK11 and the memory cell MC1 in the memory block BK12 is supplied from the outside.

In response to the supplied address, the row decoder 10 activates the block-selecting-signal line BS11 and deactivates the block-selecting-signal line BS21. The row decoder 10 deactivates the word line WL11 and activates the word lines WL12 through WL14 and WL21 through WL24. Accordingly, the transistor T11 is turned ON and the transistor T21 is turned OFF. The transistors T1 in the memory cells MC1 in the memory blocks BK11 and BK12 are turned OFF and the transistors T1 in the memory cells MC2 through MC4 in the memory blocks BK11 and BK12 are turned ON.

Figure 23:
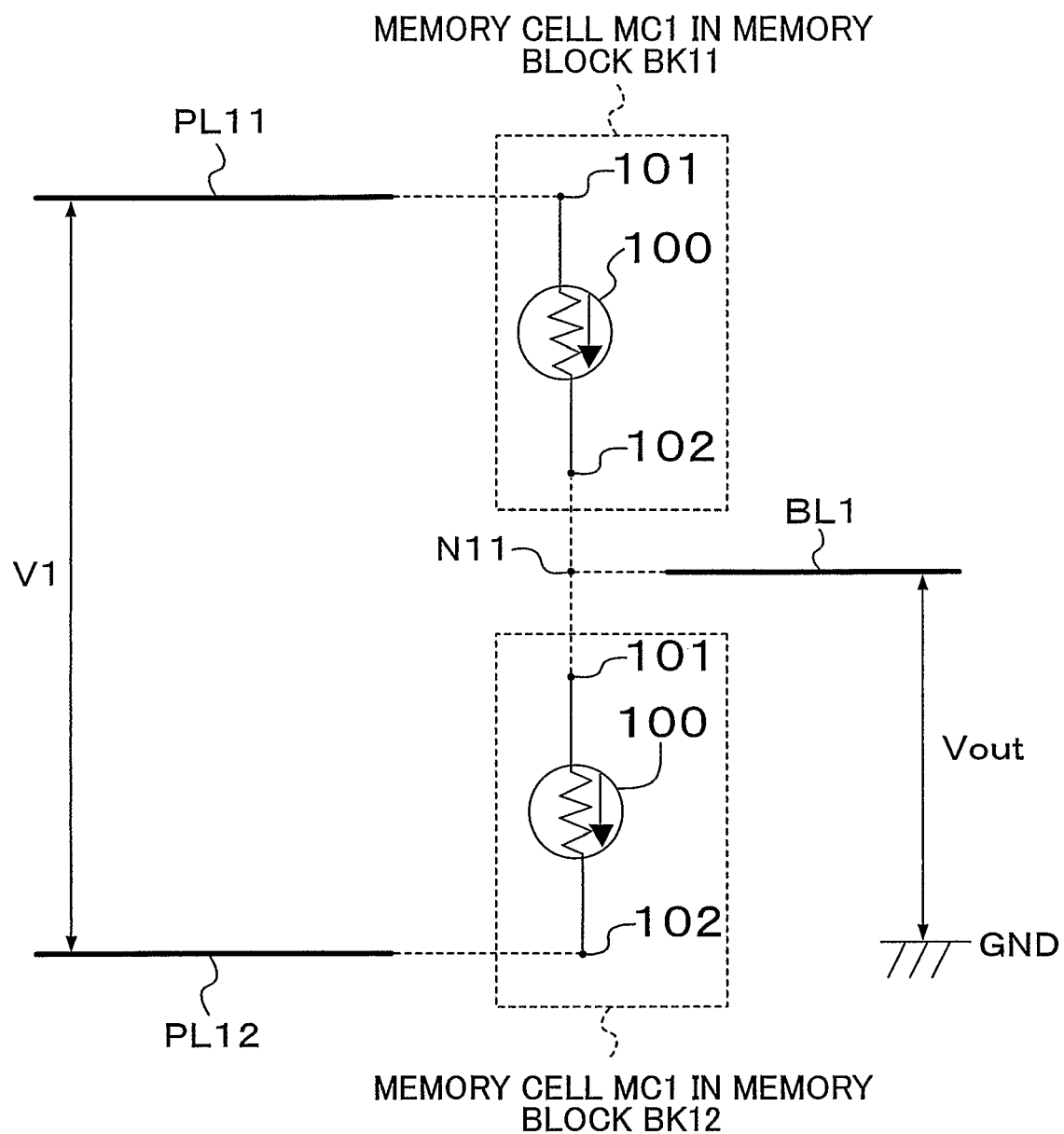
FIGS. 23 and 24 illustrate exemplary diagrams for explaining read operation of the memory LSI shown in FIG. 20.
Figure 24:
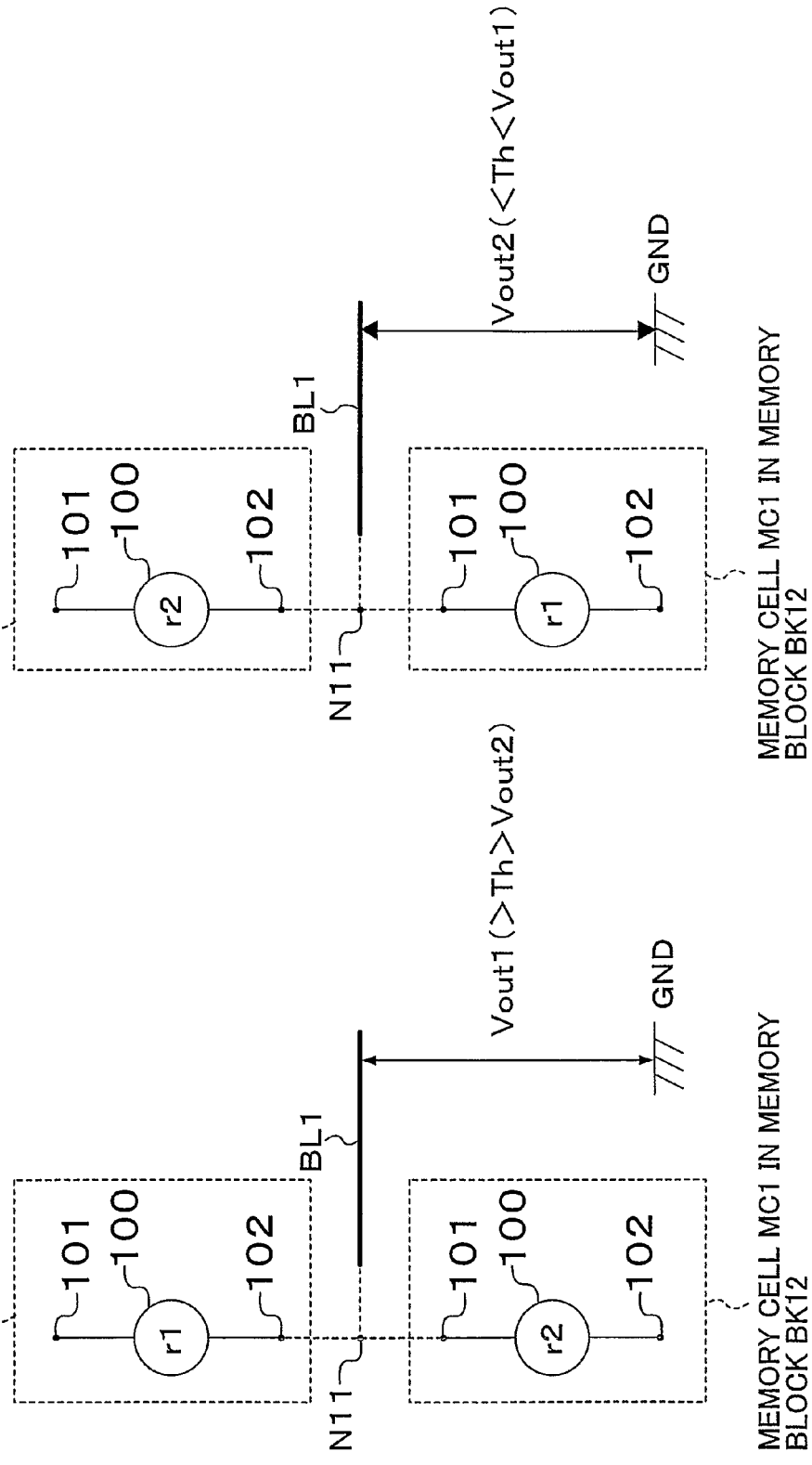

In this state, in response to the supplied address, the column decoder 20 applies a given voltage V1 between the plate line PL11 and the plate line PL12 as shown in FIG. 23. Then, the column decoder 20 detects a voltage Vought on the bit line BL1, compares the detected voltage with a given threshold value Th and, in accordance with the comparison result, outputs data "0" or "1" to the outside as read-out data. The ON-resistances of the transistor T11 and the transistors T1 in the memory cells MC2 through MC4 in the memory blocks BK11 and BK12 are substantially the same, so that the voltage Vought on the bit line BL1 varies depending on the resistance values R of the variable resistors 100 in the memory cells MC1 in the memory blocks BK11 and BK12. As shown in FIG. 24($a$), if the variable resistor 100 in the memory cell MC1 in the memory block BK11 has the low resistance r1 and the variable resistor 100 in the memory cell MC1 in the memory block BK12 has the high resistance r2, a voltage Vout1 on the bit line BL1 is detected. This voltage Vout1 is higher than the threshold value Th, so that the column decoder 20 reads data "0" and outputs the data to the outside as read-out data. On the other hand, as shown in FIG. 24($b$), if the variable resistor 100 in the memory cell MC1 in the memory block BK11 has the high resistance r2 and the variable resistor 100 in the memory cell MC1 in the memory block BK12 has the low resistance r1, a voltage Vout2 on the bit line BL1 is detected. This voltage Vout2 is lower than the threshold value Th, so that the column decoder 20 reads data "1" and outputs the data to the outside as read-out data.

Effects

As described above, in the memory LSI 700 of the seventh embodiment, one-bit information is stored in a pair of memory cells, thus further reducing errors during recording and reproduction as compared to the memory LSI 600 of the sixth embodiment.

MODIFIED EXAMPLE

In this embodiment, the four memory blocks BK11, BK12, BK21 and BK22 are arranged in rows and columns, i.e., in a matrix pattern. However, the number of memory blocks is not limited to four.

In this embodiment, the four memory cells (MC1 through MC4) are included in each of the memory blocks BK11, BK12, BK21 and BK22. However, of course, the number of memory cells is not limited to four.

Moreover, in this embodiment, a state in which the variable resistor 100 in one of a pair of memory cells has the low resistance r1 and the variable resistor 100 in the other memory cell has the high resistance r2 corresponds to "0" and a state in which the variable resistor 100 in the former memory cell has the high resistance r2 and the variable resistor 100 in the latter memory cell has the low resistance r1 corresponds to "1", thereby storing one-bit information in the pair of memory cells. However, if the pulse width and the pulse amplitude (pulse voltage) of an applied electrical pulse are adjusted, the resistance value R of the variable resistor 100 in a memory cell can be changed to a value intermediate between the maximum resistance value in the high resistance state and the minimum resistance value in the low resistance state, For example, if n-bit information is recorded/reproduced into/from a memory cell using $2^n$ (where n=2, 3, 4 ...) different resistance values, a memory device with larger capacity can be obtained.

EMBODIMENT 8

Overall Configuration of Memory LSI

Figure 25:
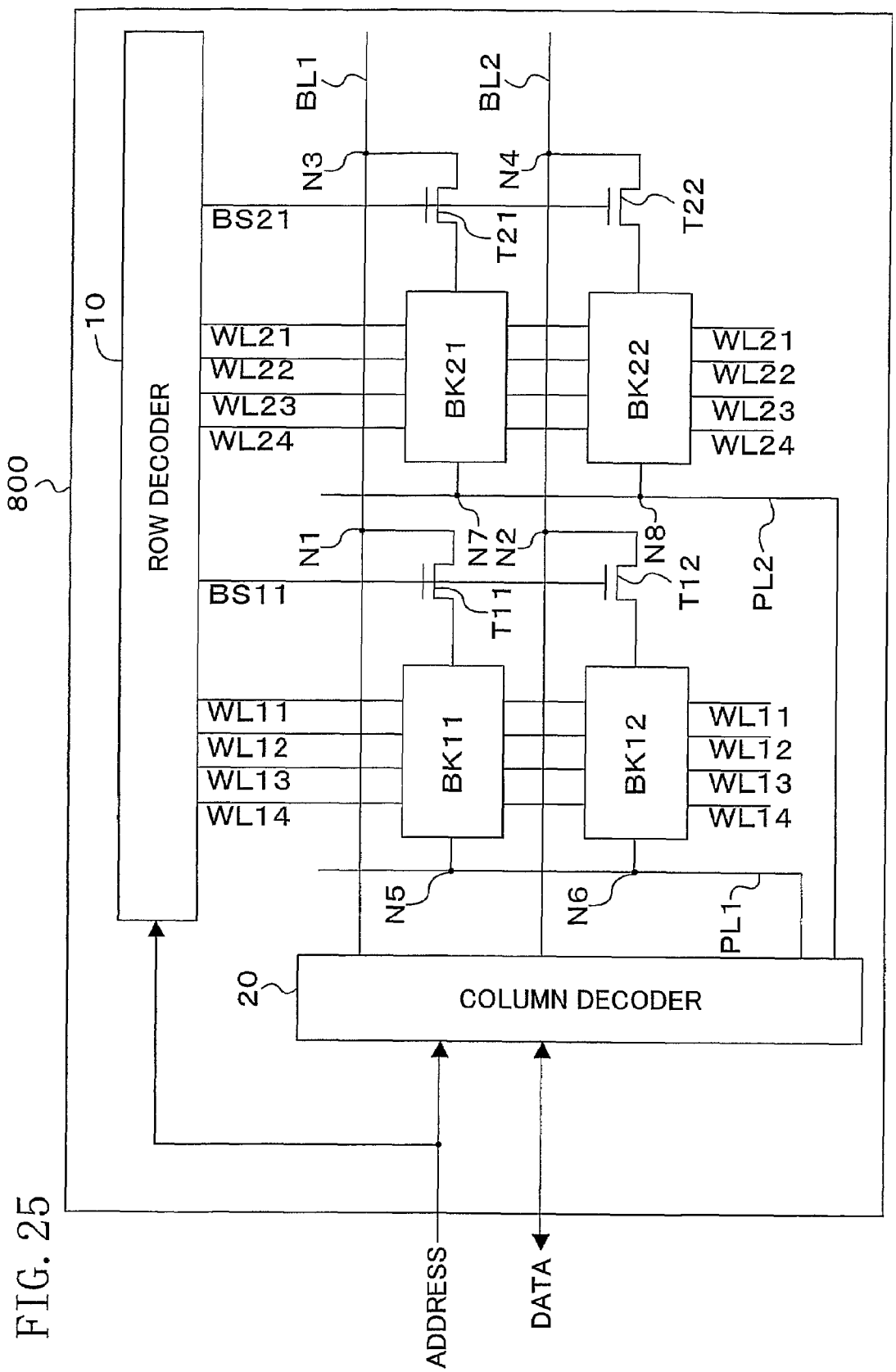
FIG. 25 is an exemplary block diagram showing an overall configuration of a memory LSI according to an eighth embodiment.

An overall configuration of a memory LSI according to an eighth embodiment of the present invention is shown in FIG. 25. This memory LSI 800 includes: memory blocks BK11, BK12, BK21 and BK22; a row decoder 10; a column decoder 20; transistors T11, T12, T21 and T22; word lines WL11 through WL14 and WL21 through WL24; bit lines BL1 and BL2; block-selecting-signal lines BS11 and BS21; and plate lines PL1, and PL2.

The transistor T11 and the memory block BK11 are connected in series between a node N1 on the bit line BL1 and a node N5 on the plate line PL1. The transistor T12 and the memory block BK12 are connected in series between a node N2 on the bit line BL2 and a node N6 on the plate line PL1. The gates of the respective transistors T11 and T12 are connected to the block-selecting-signal line BS11. The transistor T21 and the memory block BK21 are connected in series between a node N3 on the bit line BL1 and a node N7 on the plate line PL2. The transistor T22 and the memory block BK22 are connected in series between a node N4 on the bit line BL2 and a node N8 on the plate line PL2. The gates of the transistors T21 and T22 are connected to the block-selecting-signal line BS21.

Internal Configurations of Memory Blocks BK11 and BK12

Figure 26:
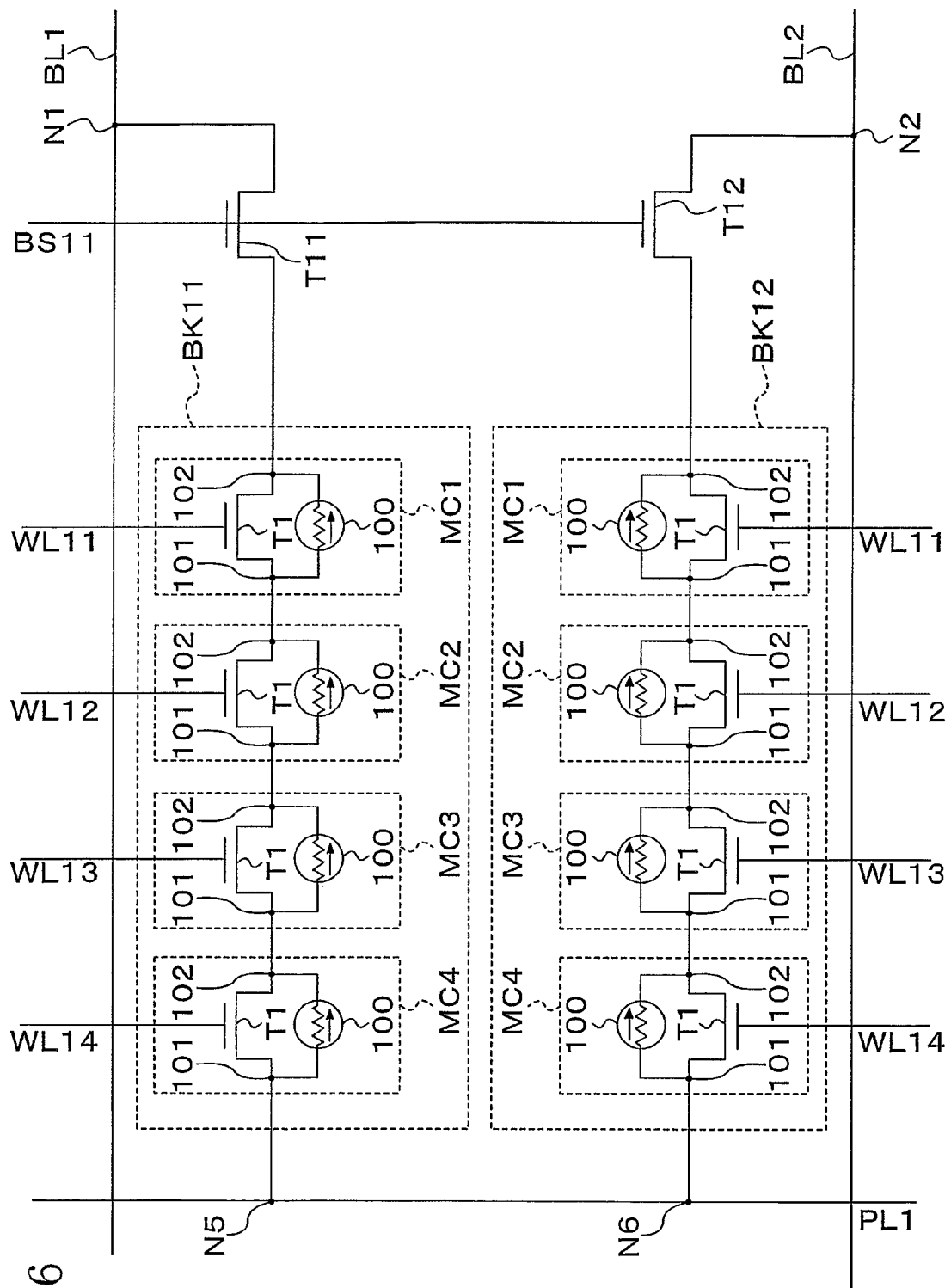
FIG. 26 shows an internal configuration of the memory block shown in FIG. 25.

FIG. 26 shows internal configurations of the memory blocks BK11 and BK12 shown in FIG. 25. Each of the memory blocks BK11 and BK12 includes memory cells MC1 through MC4. The memory cells MC1 through MC4 in the memory block BK11 are connected in series between the transistor T11 and the node N5 on the plate line PL11. Each of the memory cells MC1 through MC4 in the memory block BK11 is configured such that an electrode 101 is provided toward the plate line PL1 and an electrode 102 is provided toward the transistor T11. The memory cells MC1 through MC4 in the memory block BK12 are connected in series between the transistor T12 and the node N6 on the plate line PL1. Each of the memory cells MC1 through MC4 in the memory block BK12 is configured such that an electrode 101 is provided toward the plate line PL1 and an electrode 102 is provided toward the transistor T12.

The internal configuration of the memory block BK21 is the same as that of the memory block BK11, and the internal configuration of the memory block BK22 is the same as that of the memory block BK12.

Writing of Information Into Memory Cell

Now, write operation of the memory LSI 800 shown in FIG. 25 will be described. In this LSI 800, as in the seventh embodiment, out of the memory cells in the memory blocks BK11 and BK12, one-bit information is stored in a pair of memory cells associated with the same word line (e.g., the memory cell MC1 in the memory block BK11 and the memory cell MC1 in the memory block BK12, which are both associated with the word line WL11). In the same manner, out of the memory cells in the memory blocks BK21 and BK22, one-bit information is stored in a pair of memory cells associated with the same word line (e.g., the memory cell MC1 in the memory block BK21 and the memory cell MC1 in the memory block BK22, which are both associated with the word line WL21). Specifically, if a state in which a variable resistor 100 of one of the pair of memory cells has a low resistance r1 and a variable resistor 100 of the other has a high resistance r2 corresponds to "0" and a state in which the variable resistor 100 of the former memory cell has the high resistance r2 and the variable resistor of the latter memory cell has the low resistance r1 corresponds to "1", one-bit information is stored in the pair of memory cells. In this example, a state in which the variable resistors 100 in the memory cells in the memory blocks BK11 and BK21 have the low resistance r1 and the variable resistors 100 in the memory cells in the memory blocks BK12 and BK22 have the high resistance r2 corresponds to "0", a state in which the variable resistors 100 in the memory cells in the memory blocks BK11 and BK21 have the high resistance r2 and the variable resistors 100 in the memory cells in the memory blocks BK12 and BK22 have the low resistance r1 corresponds to "1", and information is written in the pair of memory cells consisting of the memory cell MC1 in the memory block BK11 and the memory cell MC1 in the memory block BK12.

An address indicating the pair of memory cells consisting of the memory cell MC1 in the memory block BK11 and the memory cell MC1 in the memory block BK12 and data to be written in the pair of memory cells are supplied from the outside.

In response to the supplied address, the row decoder 10 activates the block-selecting-signal line BS11 and deactivates the block-selecting-signal line BS21. The row decoder 10 deactivates the word line WL11 and activates the word lines WL12 through WL14 and WL21 through WL24. Accordingly, the transistors T11 and T12 are turned ON and the transistors T21 and T22 are turned OFF. In addition, the transistors T1 in the memory cells MC1 in the memory blocks BK11 and BK12 are turned OFF and the transistors T1 in the memory cells MC2 through MC4 in the memory blocks BK11 and BK12 are turned ON.

In this state, in response to the supplied address, the column decoder 20 applies, to each of the bit lines BL1 and BL2 and the plate line PL1, an electrical pulse whose polarity is determined by data to be written.

Figure 27:
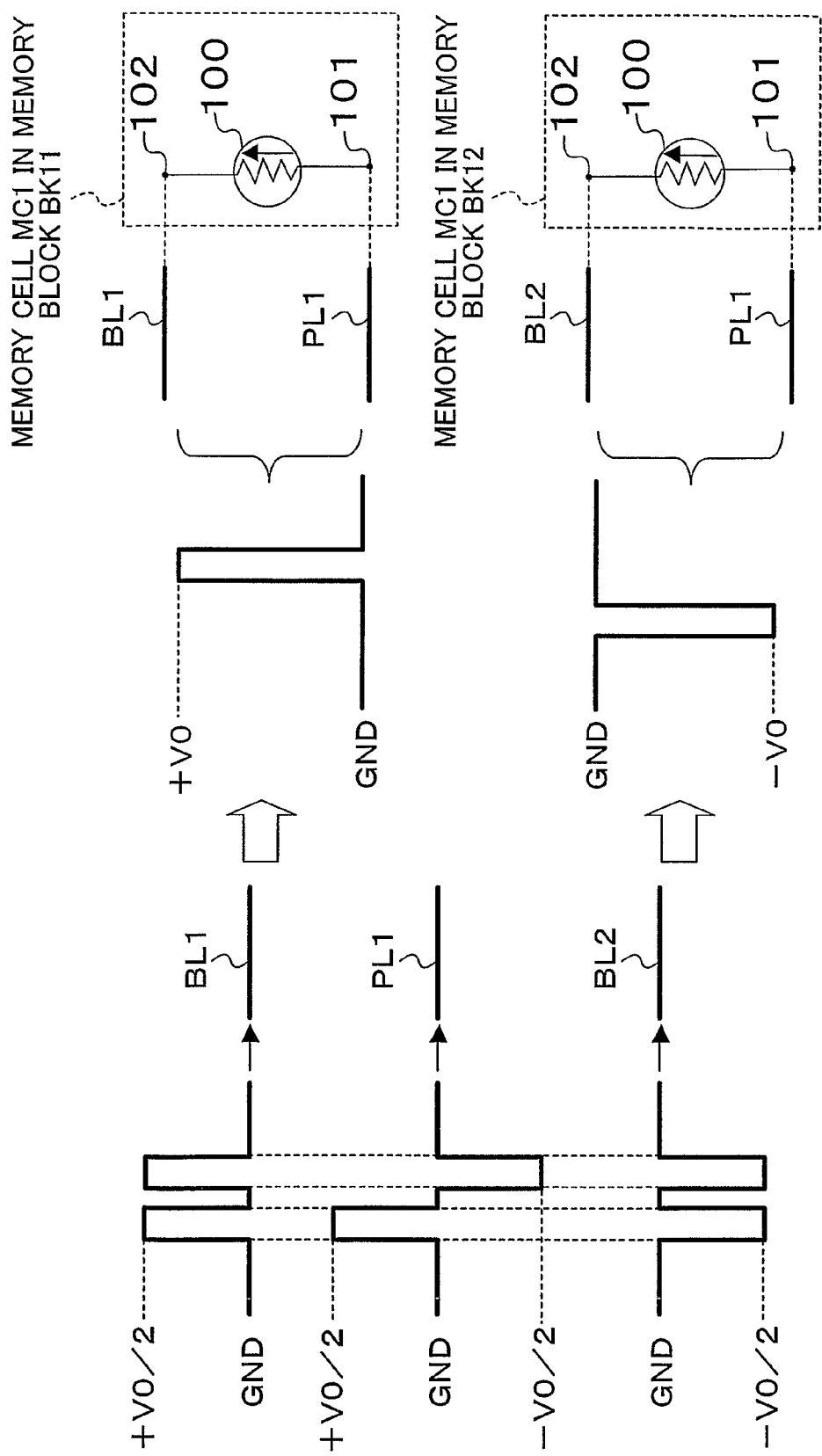
FIGS. 27 and 28 illustrate exemplary diagrams for explaining write operation of the memory LSI shown in FIG. 25.
Figure 28:
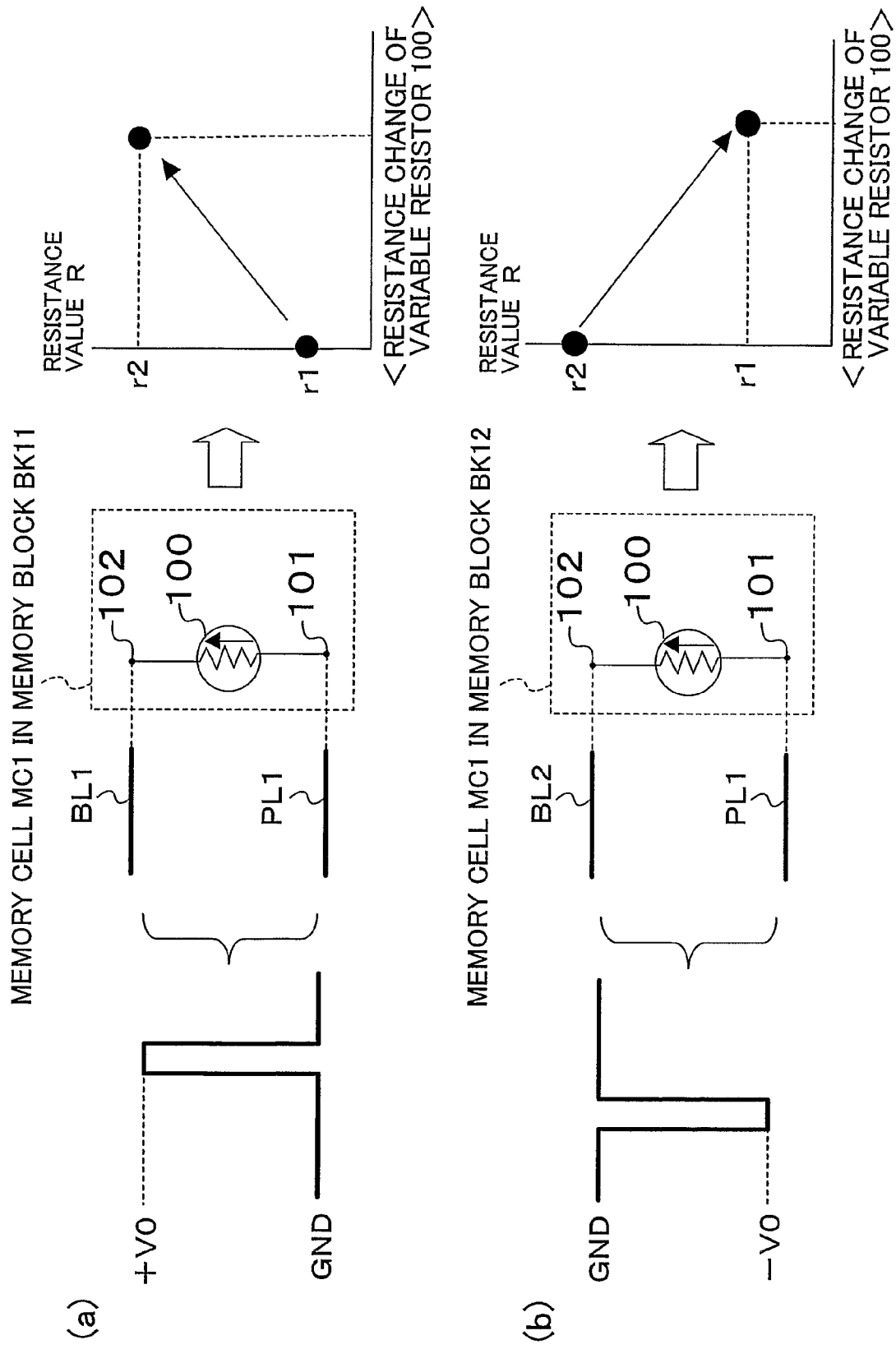

In the case of writing data "1" in the pair of memory cells consisting of the memory cell MC1 in the memory block BK11 and the memory cell MC1 in the memory block BK12, an electrical pulse as shown in FIG. 27 is applied to each of the bit lines BL1 and BL2 and the plate line PL1. Accordingly, an electrical pulse for setting the electrode 102 to positive with respect to the electrode 101 is applied to the variable resistor 100 in the memory cell MC1 in the memory block BK11, so that, as shown in FIG. 28(a), the resistance value R of the variable resistor 100 becomes r2. On the other hand, an electrical pulse for setting the electrode 102 to negative with respect to the electrode 101 is applied to the variable resistor 100 in the memory cell MC1 in the memory block BK12, so that, as shown in FIG. 28(b), the resistance value R of the variable resistor 100 becomes r1. As a result, the variable resistor 100 in the memory cell MC1 in the memory block BK11 has the high resistance r2 and the variable resistor 100 in the memory cell MC1 in the memory block BK12 has the low resistance r1, which means data "1" is written in the pair of memory cells consisting of the memory cell MC1 in the memory block BK11 and the memory cell MC1 in the memory block BK12.

On the other hand, in the case of writing data "0" in the pair of memory cells consisting of the memory cell MC1 in the memory block BK11 and the memory cell MC1 in the memory block BK12, out of electrical pulses shown in FIG. 27, the pulse applied to the bit line BL1 is replaced with the pulse applied to the bit line BL2. Accordingly, an electrical pulse for setting the electrode 102 to negative with respect to the electrode 101 is applied to the variable resistor 100 in the memory cell MC1 in the memory block BK11, and the resistance value R of the variable resistor 100 becomes r1. On the other hand, an electrical pulse for setting the electrode 102 to positive with respect to the electrode 101 is applied to the variable resistor 100 in the memory cell MC1 in the memory block BK12, and the resistance value R of the variable resistor 100 becomes r2. As a result, the variable resistor 100 in the memory cell MC1 in the memory block BK11 has the low resistance r1 and the variable resistor 100 in the memory cell MC1 in the memory block BK12 has the high resistance r2, which means data "0" is written in the pair of memory cells consisting of the memory cell MC1 in the memory block BK11 and the memory cell MC1 in the memory block BK12.

Readout of Information From Memory Cell

Now, read operation of the memory LSI 800 shown in FIG. 25 will be described. In the following example, a state in which the variable resistors 100 in the memory cells in the memory blocks BK11 and BK21 have the low resistance r1 and the variable resistors 100 in the memory cells in the memory blocks BK12 and BK22 have the high resistance r2 corresponds to "0", a state in which the variable resistors 100 in the memory cells in the memory blocks BK11 and BK12 have the high resistance r2 and the variable resistors 100 in the memory cells in the memory blocks BK12 and BK22 have the low resistance r1 corresponds to "1", and data is read out from the pair of memory cells consisting of the memory cell MC1 in the memory block BK11 and the memory cell MC1 in the memory block BK12.

An address indicating the pair of memory cells consisting of the memory cell MC1 in the memory block BK11 and the memory cell MC1 in the memory block BK12 is supplied from the outside.

In response to the supplied address, the row decoder 10 activates the block-selecting-signal line BS11 and deactivates the block-selecting-signal line BS21. The row decoder 10 deactivates the word line WL11 and activates the word lines WL12 through WL14 and WL21 through WL24. Accordingly, the transistors T11 and T12 are turned ON and the transistors T21 and T22 are turned OFF. The transistors T1 in the memory cells MC1 in the memory blocks BK11 and BK12 are turned OFF and the transistors T1 in the memory cells MC2 through MC4 in the memory blocks BK11 and BK12 are turned ON.

In this state, in response to the supplied address, the column decoder 20 applies a given voltage V1 between the bit line BL1 and the bit line BL2. Then, the column decoder 20 detects a voltage Vought on the plate line PL1, compares the detected voltage with a given threshold value Th and, in accordance with the comparison result, outputs data "0" or "1" to the outside as read-out data. The ON-resistances of the transistor T11 and the transistors T1 in the memory cells MC2 through MC4 in the memory blocks BK11 and BK12 are substantially the same, so that the voltage Vought on the plate line PL1 varies depending on the resistance values R of the variable resistors 100 in the memory cells MC1 in the memory blocks BK11 and BK12. As shown in FIG. 29(a), if the variable resistor 100 in the memory cell MC1 in the memory block BK11 has the low resistance r1 and the variable resistor 100 in the memory cell MC1 in the memory block BK12 has the high resistance r2, a voltage Vout1 on the plate line PL1 is detected. This voltage Vout1 is higher than the threshold value Th, so that the column decoder 20 reads data "0" and outputs the data to the outside as read-out data. On the other hand, as shown in FIG. 29(b), if the variable resistor 100 in the memory cell MC1 in the memory block BK11 has the high resistance r2 and the variable resistor 100 in the memory cell MC1 in the memory block BK12 has the low resistance r1, a voltage Vout2 on the plate line PL1 is detected. This voltage Vout2 is lower than the threshold value Th, so that the column decoder 20 reads data "1" and output the data to the outside as read-out data.

Effects

As described above, in the memory LSI 800 of the eighth embodiment, one-bit information is stored in a pair of memory cells, thus further reducing errors in recording and reproduction as compared to the memory LSI 600 shown in the sixth embodiment.

MODIFIED EXAMPLE

In this embodiment, the four memory blocks BK11, BK12, BK21 and BK22 are arranged in rows and columns, i.e., in a matrix pattern. However, the number of memory blocks is not limited to four.

In this embodiment, the four memory cells (MC1 through MC4) are included in each of the memory blocks BK11, BK12, BK21 and BK22. However, of course, the number of memory cells is not limited to four.

Moreover, in this embodiment, a state in which the variable resistor 100 in one of a pair of memory cells has the low resistance r1 and the variable resistor 100 in the other memory cell has the high resistance r2 corresponds to "0" and a state in which the variable resistor 100 in the former memory cell has the high resistance r2 and the variable resistor 100 in the latter memory cell has the low resistance r1 corresponds to "1", thereby storing one-bit information in the pair of memory cells. However, if the pulse width and the pulse amplitude (pulse voltage) of an applied electrical pulse are adjusted, the resistance value R of the variable resistor 100 in a memory cell can be changed to a value intermediate between the maximum resistance value in the high resistance state and the minimum resistance value in the low resistance state. For example, if n-bit information is recorded/reproduced into/from a pair of memory cells using $2^n$ (where n=2, 3, 4 . . . ) different resistance values, a memory device with larger capacity can be obtained.

EMBODIMENT 9

Figure 30:
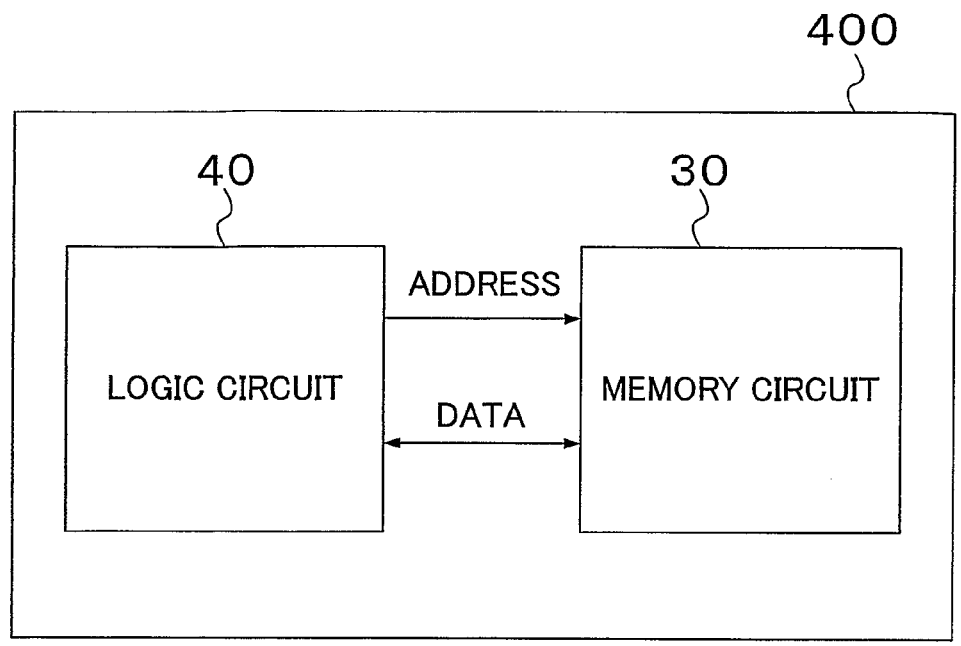
FIG. 30 is an exemplary block diagram showing a configuration of a system LSI according to a ninth embodiment.

FIG. 30 shows a configuration of a system LSI (Embedded-RAM) 400 according to a ninth embodiment of the present invention. In the system LSI 400, a memory circuit 30 and a logic circuit 40 are provided on a chip. The system LSI 400 uses the memory circuit 30 as a data RAM. The memory circuit 30 has a similar configuration and operates in a similar manner to one of the memory LSIs 600, 700 and 800 described in the sixth through eighth embodiments.

In the case of writing data in the memory circuit 30, the logic circuit 40 sets the operation mode of the memory circuit 30 at a storing mode. Then, the logic circuit 40 outputs, to the memory circuit 30, a signal indicating the address of a memory cell in which data is to be stored. Subsequently, the logic circuit 40 outputs, to the memory circuit 30, data to be written. Thereafter, the memory circuit 30 operates in a manner similar to that described in one of the sixth through eighth embodiments, and data output from the logic circuit 40 is written in the memory cell in the memory circuit 30.

On the other hand, in the case of reading data written in the memory cell in the memory circuit 30, the logic circuit 40 sets the operation mode of the memory circuit 30 at a reproducing mode. Then, the logic circuit 40 outputs, to the memory circuit 30, a signal indicating the address of a memory cell from which data is to be read out. Thereafter, the memory circuit 30 operates in a manner similar to that described in one of the sixth through eighth embodiments, and data stored in the selected memory cell is read out to be output to the logic circuit 40.

EMBODIMENT 10

Figure 31:
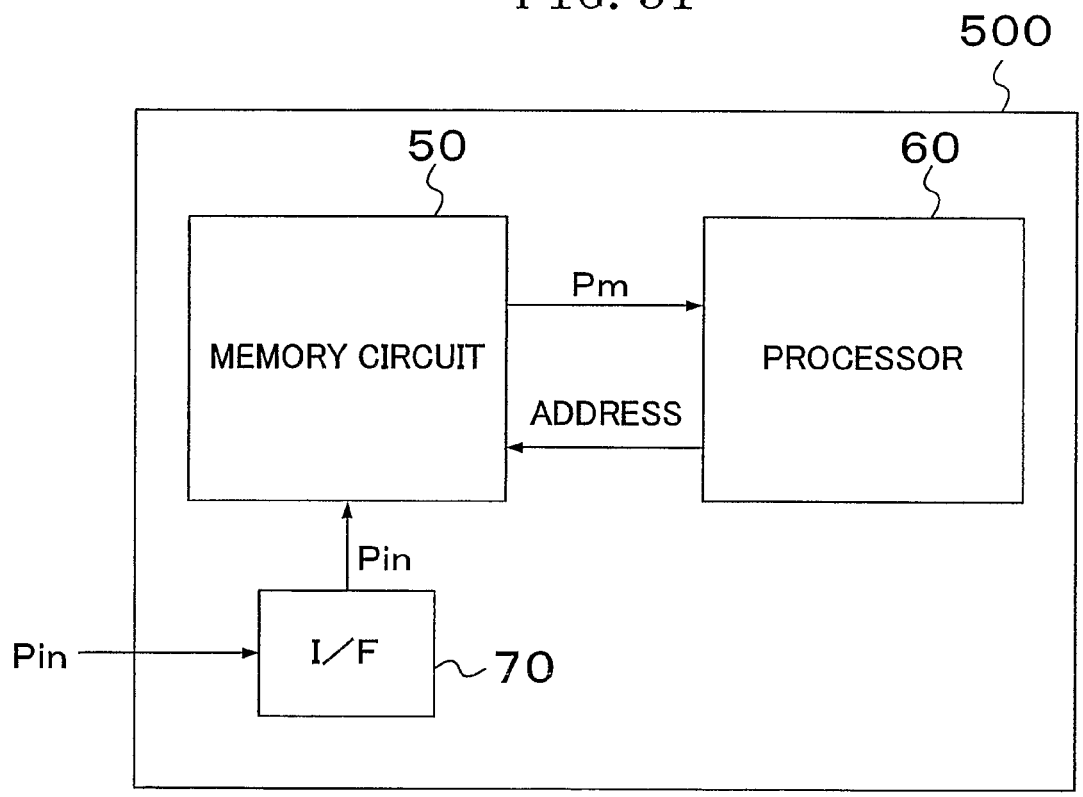
FIG. 31 is an exemplary block diagram showing a configuration of a system LSI according to a tenth embodiment.

FIG. 31 shows a configuration of a system LSI (reconfigurable LSI) 500 according to a tenth embodiment of the present invention. This system LSI 500 includes: a memory circuit 50; a processor 60; and an interface 70. In the system LSI 500, the memory circuit 50 is used as a program ROM. The memory circuit 50 has a similar configuration and operates in a similar manner to one of the memory LSIs 600, 700 and 800 described in the sixth through eighth embodiments. Programs necessary for operation of the processor 60 is stored in the memory circuit 50. The processor 60 controls the memory circuit 50 and the interface 70 and reads a program Pm stored in the memory circuit 50 to perform processing in accordance with the program. The interface 70 outputs, to the memory circuit 50, a program Pin input from the outside.

In the case of writing the program Pin from the outside into the memory circuit 50, the processor 60 sets the operation mode of the memory circuit 50 at a storing mode and outputs, to the memory circuit 50, a signal indicating the address of a memory cell in which the program Pin is to be written. Thereafter, the interface 70 inputs the program Pin input from the outside and outputs the input program Pin to the memory circuit 50. Subsequently, the memory circuit 50 operates in a manner similar to that described in one of the sixth through eighth embodiments, and the program Pin from the interface 70 is written in the memory cell.

On the other hand, in the case of reading the program Pm written in the memory circuit 50, the processor 60 sets the operation mode of the memory circuit 50 at a reproducing mode and outputs, to the memory circuit 50, a signal indicating the address of a memory cell from which the program Pm is to be read out. Thereafter, the memory circuit 50 operates in a manner similar to that described in one of the sixth through eighth embodiments, and the program Pm stored in the selected memory cell is output to the processor 60. The processor 60 operates based on the program Pm input thereto.

The memory circuit 50 is a rewritable nonvolatile memory, so that a program stored therein can be rewritten. Accordingly, a function implemented in the processor 60 can be replaced. In addition, a plurality of programs may be stored in the memory circuit 50 so as to replace the function implemented in the processor 60 in accordance with a program read out there from.

As described above, in the tenth embodiment, different functions are implementable in one LSI (i.e., a so-called re-configurable LSI is achieved).

INDUSTRIAL APPLICABILITY

A memory device according to the present invention is useful as a nonvolatile memory that requires low power, high-speed write/erase operation and large capacity.

The invention claimed is:

1. A memory device, comprising:
   a first variable resistor connected between a first terminal and a third terminal having a resistance which changes in accordance with a polarity of a pulse voltage between the first terminal and the third terminal; and
   a second variable resistor connected between the third terminal and a second terminal having a resistance which changes in a direction opposite to a direction of change of the first variable resistor in accordance with a polarity of a pulse voltage between the third terminal and the second terminal.

2. The memory device according to claim 1, wherein the resistance value of the first variable resistor and the resistance value of the second variable resistor change in accordance with a first potential applied to two of the first terminal, the second terminal and the third terminal and a second potential different from the first potential applied to the other terminal of the first terminal, the second terminal and the third terminal.

3. The memory device according to claim 2, wherein the first potential is applied with a first pulse voltage at a first time to the two of the first terminal, the second terminal and the third terminal and the second potential is applied with a second pulse voltage at the first time to the other terminal of the first terminal, the second terminal and the third terminal.

4. The memory device according to claim 3, wherein, at a second time, a third pulse voltage at the second potential is applied to the two of the first terminal, the second terminal and the third terminal and a fourth pulse voltage at the first potential is applied to the other terminal of the first terminal, the second terminal and the third terminal.

5. The memory device of claim 1, wherein resistance value of one of the first variable resistor and the second variable resistor is initialized to a value greater than that of the other variable resistor of the first variable resistor and the second variable resistor.

6. The memory device of claim 1, wherein
   the polarity of the pulse voltage applied between the first terminal and the third terminal causes a resistance value of the first variable resistor to increase if the first terminal has a first polarity and to decrease if the first terminal has a second polarity opposite to the first polarity, and
   the polarity of the pulse voltage applied between the third terminal and the second terminal causes a resistance value of the second variable resistor to increase if the third terminal has the first polarity and to decrease if the third terminal has the second polarity.

7. The memory device of claim 1, wherein a pulse voltage having a second potential is applied to the third terminal with the first and second terminals set at a first potential.

8. The memory device of claim 7, wherein the first potential is a ground potential, and the second potential is a potential other than the ground potential.

9. The memory device of claim 7, wherein the first potential is a positive potential or a negative potential and the second potential is the negative potential or the positive potential, respectively.

10. The memory device of claim 1, wherein at a first time a first pulse voltage of the first polarity is applied to the first terminal and the third terminal and a second pulse voltage of polarity opposite to the first polarity is applied to the second terminal, and at a second time the second pulse voltage is applied to the third terminal and the second terminal and the first pulse voltage is applied to the first terminal.

11. The memory device of claim 1, wherein a voltage at the third terminal is output with a first potential applied to the first terminal and a second potential applied to the second terminal.

12. A method for writing of data in a variable resistance memory cell having at least three terminals and for resetting the variable resistance memory cell, comprising the steps of:
   applying a first potential to two terminals of the at least three terminals of the variable resistance memory cell;
   applying a second potential to a terminal other than the two terminals of the variable resistance memory cell;
   changing a resistance value of a first variable resistance device of the variable resistance memory cell; and
   changing a resistance value of a second variable resistance device of the variable resistance memory cell in a direction opposite to that of the first variable resistance memory device.

13. The method of claim 12, wherein during data writing, the second potential has a first polarity and during a resetting operation, the second potential has a second polarity opposite of the first polarity.

14. The method of claim 12, further comprising the steps of:
   changing a resistance value of a first variable resistance device of the variable resistance memory cell;
   changing a resistance value of a second variable resistance device of the variable resistance memory cell in a direction opposite to that of the first variable resistance memory device.

15. The method of claim 12, wherein
   the step of applying the first potential comprises applying a first pulse of the first potential at a first time, and
   the step of applying the second potential comprises applying a second pulse of the second potential at the first time having a second polarity opposite of a first polarity of the first pulse.

16. The method of claim 15, further comprising the steps of:
   applying a third potential of the second polarity to two terminals of the at least three terminals of the variable resistance memory cell at a second time; and
   applying a fourth potential of the first polarity to a terminal other than the two terminals of the variable resistance memory cell at the second time.

17. A memory cell for storing at least one bit of data, comprising:
   first variable resistance means for changing resistance in accordance with a polarity of a pulse voltage between a first terminal and a third terminal; and
   second variable resistance means for changing resistance in a direction opposite to a direction of change of the first variable resistance means in accordance with a polarity of a pulse voltage between the third terminal and a second terminal.

* * * * *